United States Patent
Yoon et al.

(10) Patent No.: US 8,654,587 B2
(45) Date of Patent: Feb. 18, 2014

(54) NONVOLATILE MEMORY DEVICES, CHANNEL BOOSTING METHODS THEREOF, PROGRAMMING METHODS THEREOF, AND MEMORY SYSTEMS INCLUDING THE SAME

(71) Applicants: ChiWeon Yoon, Seoul (KR); Donghyuk Chae, Seoul (KR); Sang-Wan Nam, Hwaseong-si (KR); Sung-Won Yun, Suwon-si (KR)

(72) Inventors: ChiWeon Yoon, Seoul (KR); Donghyuk Chae, Seoul (KR); Sang-Wan Nam, Hwaseong-si (KR); Sung-Won Yun, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/920,691

(22) Filed: Jun. 18, 2013

(65) Prior Publication Data

US 2013/0279262 A1    Oct. 24, 2013

Related U.S. Application Data

(62) Division of application No. 13/152,776, filed on Jun. 3, 2011, now Pat. No. 8,493,789.

(30) Foreign Application Priority Data

Aug. 11, 2010    (KR) .................. 10-2010-0077473

(51) Int. Cl.
*G11C 11/34* (2006.01)
*G11C 16/04* (2006.01)

(52) U.S. Cl.
USPC ............ 365/185.18; 365/185.05; 365/185.17; 365/185.27; 365/185.28

(58) Field of Classification Search
USPC ............ 365/185.05, 185.17, 185.18, 185.27, 365/185.28

See application file for complete search history.

(56) References Cited

U.S. PATENT DOCUMENTS

| | | | |
|---|---|---|---|
| 7,387,935 B2 | 6/2008 | Masuoka et al. | |
| 2005/0063237 A1 | 3/2005 | Masuoka et al. | |
| 2007/0236992 A1 | 10/2007 | Oowada | |
| 2007/0236993 A1 | 10/2007 | Oowada | |
| 2007/0242511 A1 | 10/2007 | Chen et al. | |
| 2009/0268523 A1 | 10/2009 | Maejima | |
| 2010/0020617 A1 | 1/2010 | Oh et al. | |
| 2010/0054036 A1* | 3/2010 | Lee et al. | 365/185.03 |
| 2010/0097862 A1 | 4/2010 | Kang et al. | |
| 2010/0172182 A1* | 7/2010 | Seol et al. | 365/185.17 |
| 2010/0322000 A1* | 12/2010 | Shim et al. | 365/185.03 |
| 2010/0327323 A1* | 12/2010 | Choi | 257/202 |
| 2011/0019486 A1 | 1/2011 | Jang et al. | |
| 2011/0051524 A1* | 3/2011 | Hsu et al. | 365/185.22 |
| 2011/0209031 A1* | 8/2011 | Kim et al. | 714/763 |

FOREIGN PATENT DOCUMENTS

KR    2007-0096972 A    10/2007
KR    20100011196 A    2/2010

\* cited by examiner

*Primary Examiner* — Ly D Pham
(74) *Attorney, Agent, or Firm* — Harness, Dickey & Pierce, P.L.C.

(57) ABSTRACT

Non-volatile memory device channel boosting methods in which at least two strings are connected to one bit line, the channel boosting methods including applying an initial channel voltage to channels of strings in a selected memory block, floating inhibit strings each having an un-programmed cell among the strings, and boosting channels of the floated inhibit strings.

6 Claims, 31 Drawing Sheets

NONVOLATILE MEMORY DEVICES, CHANNEL BOOSTING METHODS THEREOF, PROGRAMMING METHODS THEREOF, AND MEMORY SYSTEMS INCLUDING THE SAME

CROSS-REFERENCE TO RELATED APPLICATIONS

This application is a Divisional of U.S. application Ser. No. 13/152,776 filed on Jun. 3, 2011 which claims priority under 35 U.S.C §119 to Korean Patent Application No. 10-2010-0077473 filed Aug. 11, 2010 in the Korean Intellectual Property Office (KIPO), the entire contents of each of which is incorporated herein by reference.

BACKGROUND

1. Field

Example embodiments of the inventive concepts relate to non-volatile memory devices, channel boosting methods thereof, programming methods thereof, and memory systems including the same.

2. Description of the Related Art

Semiconductor memory devices are vital microelectronic components commonly found in digital logic systems, such as computers, and microprocessor-based applications ranging from satellites to consumer electronics. Therefore, advances in the fabrication of semiconductor memory devices, including process enhancements and circuit-design-related developments that allow scaling to higher memory densities and faster operating speeds, help establish performance standards for other digital logic families.

Semiconductor memory devices generally include volatile semiconductor memory devices and non-volatile semiconductor memory devices. Non-volatile semiconductor memory devices are capable of storing data even with the power turned off. The non-volatile memory data storage state may be permanent or reprogrammable, depending upon the fabrication technology used. Non-volatile semiconductor memories are used for program and microcode storage in a wide variety of applications in the computer, avionics, telecommunications, and consumer electronics industries.

A representative non-volatile memory device is a flash memory device. As the demand on the high integration of a memory device increases, multi-bit memory devices storing multi-bit data per memory cell are becoming more common.

SUMMARY

At least one example embodiment of the inventive concepts provides a channel boosting method of a non-volatile memory device in which at least two strings are connected to one bit line. The channel boosting method includes applying an initial channel voltage to channels of strings in a selected memory block, floating inhibit strings each having an unprogrammed cell among the strings and boosting channels of the floated inhibit strings.

According to example embodiments, the initial channel voltage may be a bit line program voltage. According to example embodiments, the initial channel voltage may be a bit line program-inhibit voltage. According to example embodiments, each of the strings may be connected with a corresponding bit line and extends in a direction vertical to a substrate. According to example embodiments, program strings each having a memory cell to be programmed may be shut off to be floated. According to example embodiments, inhibit strings corresponding to selected bit lines may be shut off to be floated, and inhibit strings corresponding to unselected bit lines may be electrically isolated to be floated. According to example embodiments, the channel boosting may be accomplished by applying a pass voltage to unselected word lines, and the pass voltage may be applied to a selected word line during a predetermined period.

Other example embodiments of the inventive concepts provide a program method of a non-volatile memory device which includes groups of memory cells sequentially provided in a direction vertical to a substrate and in which at least two strings are connected to one bit line. The program method includes performing a bit line setup operation together with a channel boosting operation and performing a program execution operation by applying a program voltage to a selected word line.

According to example embodiments, the bit line setup operation may include a first bit line setup period, during the first bit line setup period, a power supply voltage being applied to unselected bit lines, all strings of a selected memory block being floated by the selected word line, a pass voltage being applied to the selected word line and unselected word lines. According to example embodiments, during the first bit line setup period, the all strings may be floated by applying a ground voltage to a ground selection line and to all string selection lines. According to example embodiments, the bit line setup operation may further include a second bit line setup period, and during the second bit line setup period, a channel of a string corresponding to a selected one of all string selection lines is set to a ground voltage by applying a power supply voltage to the selected string selection line.

According to example embodiments, the program voltage may be applied to the selected word line following the second bit line setup period. According to example embodiments, the bit line setup operation may include a first bit line setup period in which a power supply voltage is applied to all bit lines and all string selection lines and a ground voltage is applied to a ground selection line. According to example embodiments, a ground voltage may be applied to at least one unselected one of the all string selection lines. According to example embodiments, the bit line setup operation may further include a second bit line setup period in which a ground voltage is applied to a selected one of the all bit lines in synchronization with applying of a ground voltage into the at least one unselected string selection line, and a pass voltage is applied to unselected word lines following the second bit line setup period.

According to at least one example embodiment, a channel boosting method of a non-volatile memory device in which at least two strings are connected to one bit line includes applying an initial channel voltage to channels of strings in a selected memory block, floating inhibit strings of the strings in the selected memory block and boosting channel voltages of the floated inhibit strings.

According to at least one example embodiment, a method of programming a three-dimensional (3D) non-volatile memory device includes applying a first channel voltage to a channel of a selected memory string and channels of a plurality of unselected memory strings and applying a second channel voltage to the channel of the selected memory string.

BRIEF DESCRIPTION OF THE DRAWINGS

Example embodiments of the inventive concepts will be more clearly understood from the following brief description taken in conjunction with the accompanying drawings.

FIG. 1 is a block diagram of non-volatile memory devices according to example embodiments of the inventive concepts;

FIG. 2 is a perspective view of one of memory blocks illustrated in FIG. 1;

FIG. 3 is a cross-sectional view taken along line III-III' of the memory block illustrated in FIG. 2;

FIG. 4 is a cross-sectional diagram of a transistor structure ST illustrated in FIG. 3;

FIG. 5 is an equivalent circuit diagram of a memory block illustrated in FIGS. 2-4;

FIG. 6 is a schematic diagram showing a bias condition of a program operation according to example embodiments of the inventive concepts;

FIG. 7 is a timing diagram of a program operation according to example embodiments of the inventive concepts;

FIG. 8 is a schematic diagram showing a bias condition of a program operation according to other to example embodiments of the inventive concepts;

FIG. 9 is a timing diagram of a program operation according to other to example embodiments of the inventive concepts;

FIG. 10 is a flowchart of channel boosting methods of non-volatile memory devices according to example embodiments of the inventive concepts;

FIG. 11 is a flowchart of program methods of non-volatile memory devices according to example embodiments of the inventive concepts;

FIG. 12 is an equivalent circuit diagram of a memory block illustrated in FIGS. 1-4 according to example embodiments of the inventive concepts;

FIG. 13 is an equivalent circuit diagram of a memory block illustrated in FIGS. 1-4 according to still other example embodiments of the inventive concepts;

FIG. 14 is an equivalent circuit diagram of a memory block illustrated in FIGS. 1-4 according to yet other example embodiments of the inventive concepts;

FIG. 15 is an equivalent circuit diagram of a memory block illustrated in FIGS. 1-4 according to further example embodiments of the inventive concepts;

FIG. 16 is an equivalent circuit diagram of a memory block illustrated in FIGS. 1-4 according to still further example embodiments of the inventive concepts;

FIG. 17 is an equivalent circuit diagram of a memory block illustrated in FIGS. 1-4 according to yet still other example embodiments of the inventive concepts;

FIG. 18 is a perspective view of one of memory blocks illustrated in FIG. 1 according to other example embodiments of the inventive concepts;

FIG. 19 is a perspective view of one of the memory blocks illustrated in FIG. 1 according to still other example embodiments of the inventive concepts;

FIG. 20 is a cross-sectional view taken along line XX-XX' of the memory block illustrated in FIG. 19;

FIG. 21 is a perspective view of one of the memory blocks illustrated in FIG. 1 according to yet still other example embodiments of the inventive concepts;

FIG. 22 is a cross-sectional view taken along line XXII-XXII' of the memory block illustrated in FIG. 21;

FIG. 23 is a perspective view of one of the memory blocks illustrated in FIG. 1 according to still further example embodiments of the inventive concepts;

FIG. 24 is a cross-sectional view taken along line XXIV-XXIV' of the memory block illustrated in FIG. 23;

FIG. 25 is a block diagram illustrating memory systems according to example embodiments of the inventive concepts;

FIG. 26 is a block diagram illustrating memory cards according to example embodiments of the inventive concepts;

FIG. 27 is a block diagram illustrating moviNANDs according to example embodiments of the inventive concepts;

FIG. 28 is a block diagram illustrating SSDs according to example embodiments of the inventive concepts;

FIG. 29 is a block diagram of computing systems according to example embodiments of the inventive concepts;

FIG. 30 is a block diagram of electronic devices according to example embodiments of the inventive concepts; and FIG. 31 is a block diagram of server systems according to example embodiments of the inventive concepts.

Figure 1:
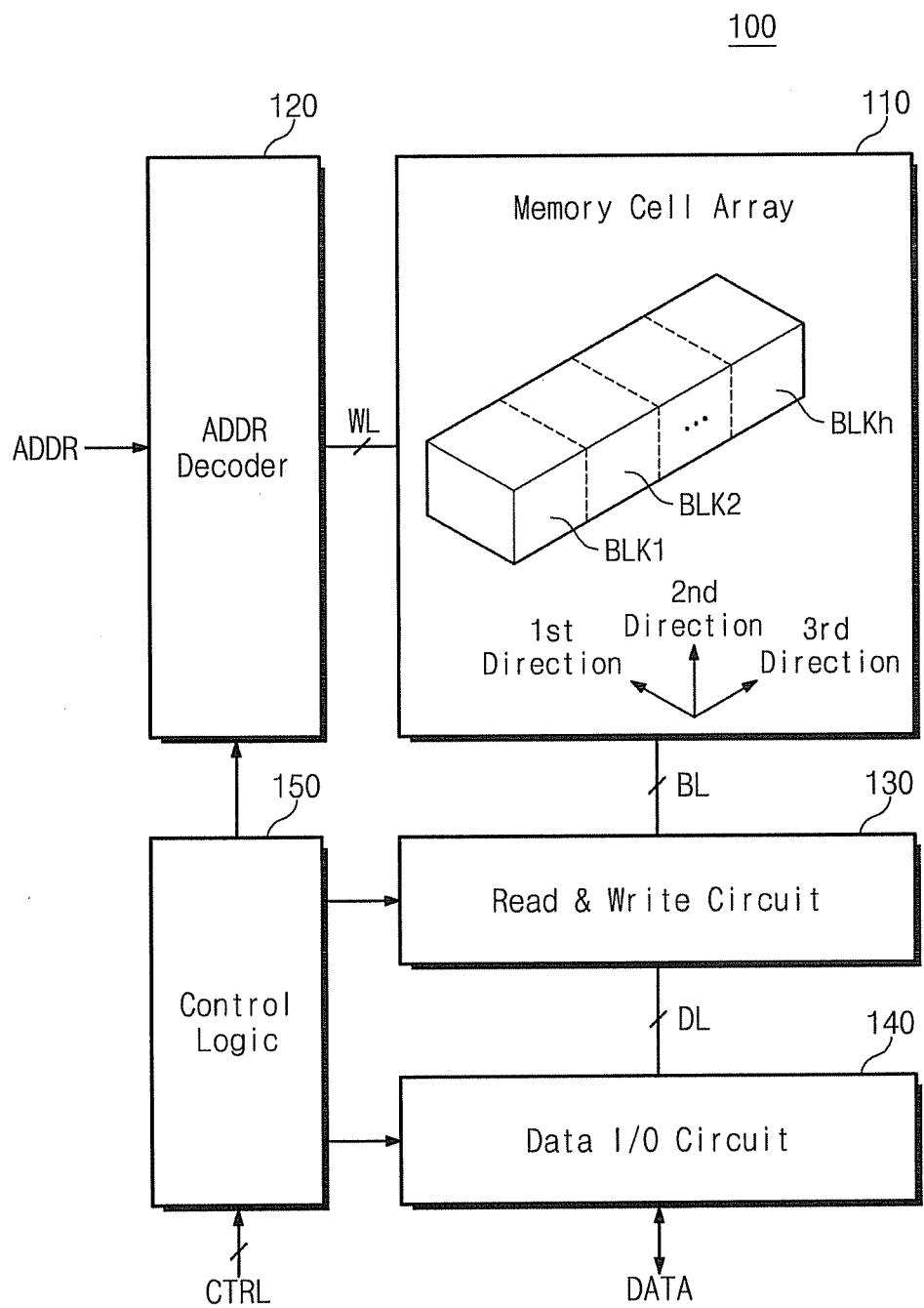
FIGS. 1-31 represent non-limiting, example embodiments as described herein.

It should be noted that these figures are intended to illustrate the general characteristics of methods, structure and/or materials utilized in certain example embodiments of the inventive concepts and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of he inventive concepts may, however, be embodied in many different forms and should not be construed as being limited to the example embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

According to example embodiments of the inventive concepts, non-volatile memory devices may be configured such that at least two strings are connected with one bit line. At programming, all inhibit strings that are floated may be channel boosted after an initial voltage is applied to channels of all strings within a selected memory block. Inhibit strings are strings each having a program inhibited memory cell among strings each having a memory cell connected with a selected word line.

According to example embodiments, the inhibit string may be a string (hereinafter, referred to as the first inhibit string) with a memory cell connected with a selected word line and an unselected bit line or a string (hereinafter, referred to as the second inhibit string) having a program inhibited memory cell connected with a selected word line and a selected bit line. A program string may be a string with a memory cell to be programmed among strings each with a memory cell connected with a selected word line and a selected bit line.

Channel boosting according to an example embodiments of the inventive concepts may be performed under the same initial condition. This may allow an optimized and/or improved pass voltage to be determined. No program disturbance may be generated. A program disturbance may represent that memory cells connected with unselected word lines adjacent to a selected word line are programmed according to a program voltage.

A non-volatile memory device according to at least one example embodiments of the inventive concepts may be, for example, a vertical NAND flash memory, a NAND flash memory, a NOR flash memory, a resistive RAM (RRAM), a phase-change RAM (PRAM), a magnetroresistive RAM (MRAM), a ferroelectric RAM (FRAM), and/or a spin transfer torque RAM (STT-RAM). The non-volatile memory device may be implemented with a three-dimensional array structure. Example embodiments of the inventive concepts may be applied to both a flash memory device with a conductive floating gate as a charge storing layer and a charge trap flash (CTF) memory with an insulation film as a charge storing layer. For ease of description, it may be assumed that the non-volatile memory device according to example embodiments of the inventive concepts may be a vertical NAND flash memory.

FIG. 1 is a block diagram of non-volatile memory devices according to example embodiments of the inventive concepts. Referring to FIG. 1, a non-volatile memory device 100 may include a memory cell array 110, an address decoder 120, a read and write circuit 130, a data input/output circuit 140, and control logic 150. The memory cell array 110 may be connected both to the address decoder 120 via word lines WL and to the read and write circuit 130 via bit lines BL. The memory cell array 110 may include a plurality of memory cells. Each memory cell may store one or more data bits.

The memory cell array 110 may include a plurality of memory blocks BLK1-BLKh, each of which may be of a three-dimensional (or, vertical) structure. For example, each of the memory blocks BLK1-BLKh may include structures extending in the first to third directions. In at least one example embodiment, each of the memory blocks BLK1-BLKh may include a plurality of strings extending in the second direction. For example, a plurality of strings may be provided in the first and third directions. Each string may be connected with a bit line BL, a string selection line SSL, a ground selection line GSL, word lines WL and a common source line CSL. The respective memory blocks BLK1-BLKh may be connected with a plurality of bit lines BL, a plurality of string selection lines SSL, a plurality of ground selection line GSL, a plurality of word lines WL, and a plurality of common source lines CSL.

The address decoder 120 may be connected with the memory cell array 110 via the word lines WL. The address decoder 120 may be configured to operate responsive to the control of the control logic 150. The address decoder 120 may receive an address ADDR from the outside. The address decoder 120 may decode a row address of the input address ADDR to select corresponding word lines of the plurality of word lines WL. The address decoder 120 may decode a column address of the input address ADDR to transfer the decoded address to the read and write circuit 130. According to at least one example embodiment, the address decoder 120 may include well-known constituent elements such as a row decoder, a column decoder, an address buffer, and the like.

The read and write circuit 130 may be connected to the memory cell array 110 via the bit lines BL and to the data input/output circuit 140 via data lines DL. The read and write circuit 130 may operate responsive to the control of the control logic 150. The read and write circuit 130 may receive the decoded column address from the address decoder 120. The read and write circuit 130 may select the bit lines BL using the decoded column address. According to at least one example embodiment, the read and write circuit 130 may receive data from the data input/output circuit 140 to store it in the memory cell array 110. The read and write circuit 130 may read data from the memory cell array 110 to send it to the data input/output circuit 140. The read and write circuit 130 may be configured to perform a copy-back operation.

According to example embodiments, the read and write circuit 130 may include well-known elements such as a page buffer (or, a page register), a column selecting circuit, and the like (not shown). According to other example embodiments, the read and write circuit 130 may include well-known elements such as a sense amplifier, a write driver, a column selecting circuit, and the like (not shown). The data input/output circuit 140 may be connected to the read and write circuit 130 via the data lines DL. The data input/output circuit 140 may operate responsive to the control of the control logic 150. The data input/output circuit 140 may be configured to exchange data DATA with an external device. The data input/output circuit 140 may be configured to transfer data DATA provided from the external device to the read and write circuit 130 via the data lines DL.

The data input/output circuit 140 may be configured to output data DATA transferred from the read and write circuit 130 via the data lines to the external device. According to at least one example embodiment, the data input/output circuit 140 may include a well-known element, for example, a data buffer (not shown). The control logic 150 may be connected with the address decoder 120, the read and write circuit 130, and the data input/output circuit 140 and may be configured to control an overall operation of the flash memory device 100. The control logic 150 may operate responsive to control signals CTRL transferred from the external device.

The control logic 150 may control a program operation such that inhibit strings may be channel boosted from the same initial channel voltage (e.g., a ground voltage or a pre-charge voltage). According to the control of the control logic 150, at a program operation, channels of all inhibit strings may have the same initial channel voltage, and then channels of floated inhibit strings may be boosted.

The following advantages may be obtained by setting inhibit strings to the same initial channel voltage. Typically, at a program operation, a non-volatile memory device may set up bit lines and then may perform a channel boosting operation. For this reason, an initial channel voltage of a first inhibit string connected with an unselected bit line may be different from that of the second inhibit string connected with a selected bit line. That is, channel boosting may be made under different initial conditions. For example, an initial channel voltage of the second inhibit string connected with a selected bit line may be a bit line program voltage (e.g., 0V), and an initial channel voltage of the first inhibit string connected with an unselected bit line may be a bit line program inhibit voltage (e.g., a pre-charge voltage). Accordingly, initial conditions of the first and second inhibit strings are different from each other. This may make it difficult to secure a pass voltage window (a Vpass window). It may be difficult to determine an optimum and/or improved pass voltage for optimizing the program disturbance.

The non-volatile memory device 100 according to at least one example embodiment of the inventive concepts may be configured, at a program operation, such that channel boosting may be made after the same initial channel voltage may be applied to inhibit strings. The non-volatile memory device 100 may make it easy to secure the pass voltage window. In other words, it may be easy to determine an optimum and/or improved pass voltage of the non-volatile memory device 100. A non-volatile memory device 100 according to example embodiments of the inventive concepts may perform a bit line setup operation together with channel boosting at a program operation. It may be possible to reduce a program time as compared with the case that channel boosting may be made after a bit line setup operation is executed.

Figure 2:
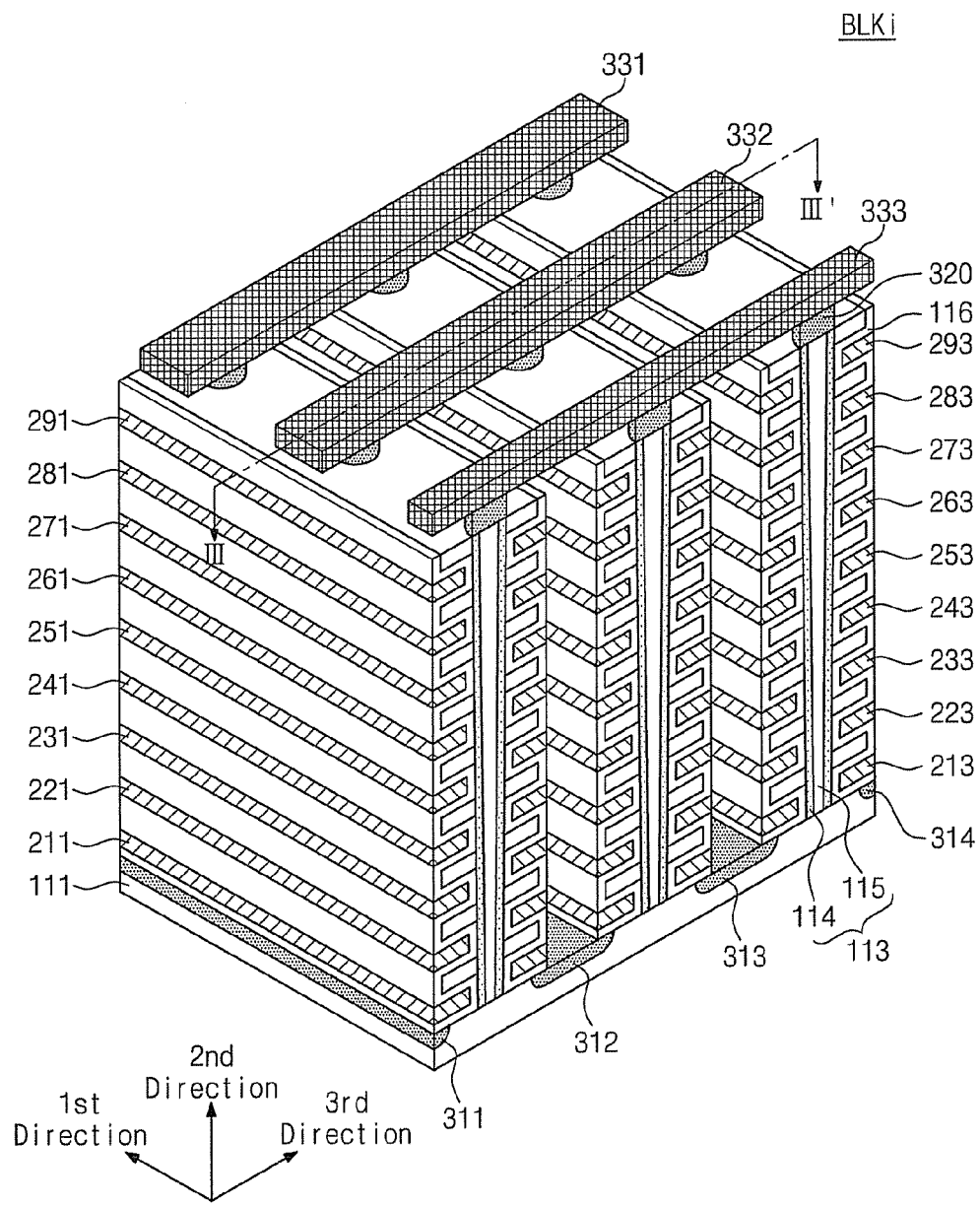
Figure 3:
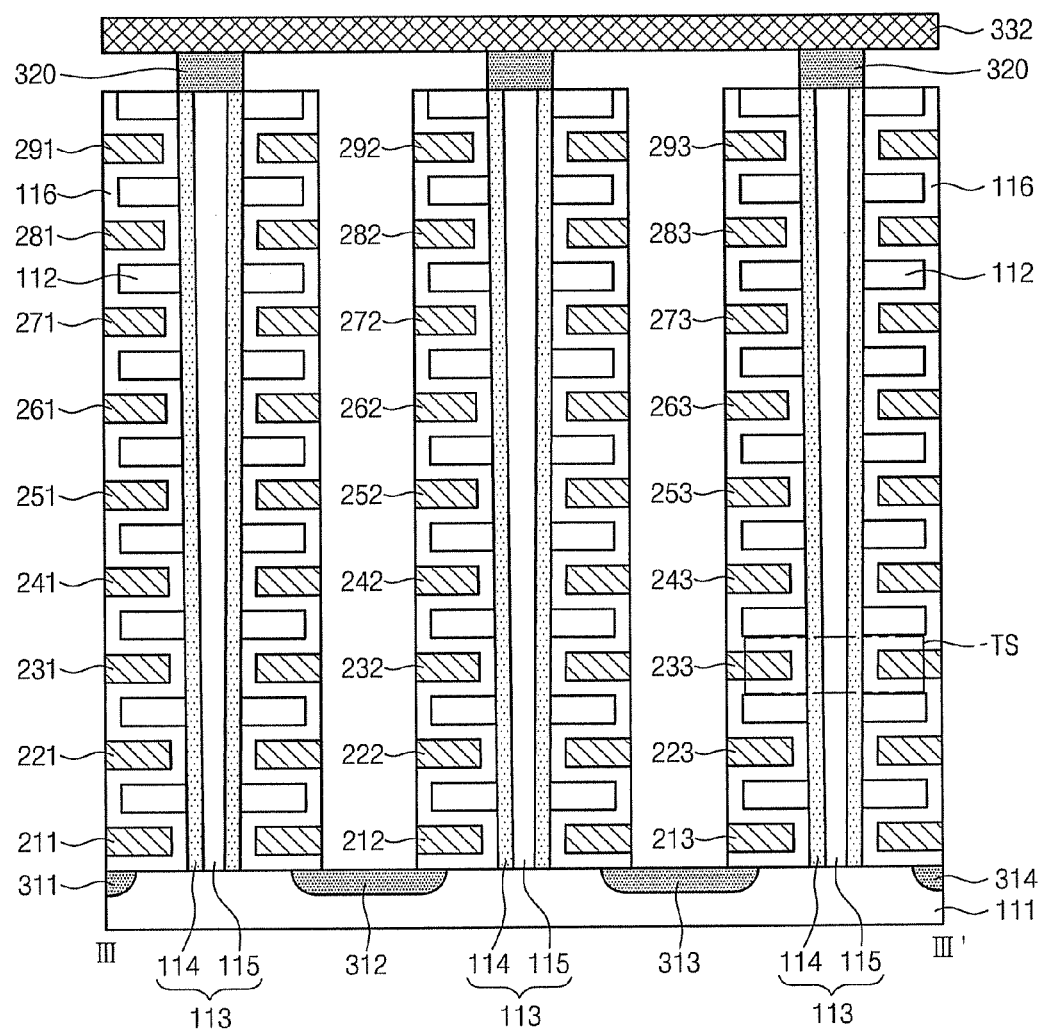

FIG. 2 is a perspective view of one of memory blocks illustrated in FIG. 1. FIG. 3 is a cross-sectional view taken along line III-III' of the memory block illustrated in FIG. 2. Referring to FIGS. 2 and 3, a memory block BLKi may include structures that extend in the first to third directions. A substrate 111 may be provided. The substrate 111 may include a silicon material to which a first type impurity may be injected. For example, the substrate 111 may include a silicon material to which a p-type impurity is injected. As an example, the substrate 111 may be a p-type well (or, a pocket p-well). For example, the substrate may include an n-type well which surrounds a p-type well. For purposes of explanation, it may be assumed that the substrate 111 is p-type silicon. However, the substrate 111 is not limited thereto.

A plurality of doping regions 311-314 extending in the first direction may be provided onto the substrate 111. For example, a plurality of doping regions 311-314 may be a second conductivity type different from that of the substrate 111. For example, the doping regions 311-314 may be n-type. It may be assumed for purposes of explanation that the first to fourth doping regions 311-314 are n-type. However, the first to fourth doping regions 311-314 are not limited thereto. In a region on the substrate 111 between the first and second doping regions 311 and 312, a plurality of insulating materials 112 extending in the first direction may be sequentially provided in the second direction. For example, the plurality of insulating materials 112 and the substrate 111 may be formed to be separated by a distance in the second direction. For example, the insulating materials 112 may be separated by a distance in the second direction. The insulating materials 112 may include an insulating material, for example, silicon oxide.

In the region on the substrate 111 between the first and second doping regions 311 and 312, a plurality of pillars 113 may be provided, sequentially disposed in the first direction, and pass through the insulating materials 112 in the second direction. The pillars 113 may be connected to the substrate 111 through the insulating materials 112. Each of the pillars 113 may include a plurality of materials. For example, the surface layer 114 of each pillar 113 may include a silicon material having the first type. For example, the surface layer 114 of each pillar 113 may include a silicon material which may be doped a material of the same conductivity type as the substrate 111. It may be assumed for purposes of explanation that the surface layer 114 of each pillar 113 may include p-type silicon. However, the surface layer 114 of each pillar 113 are not limited thereto.

The inner layer 115 of each pillar 113 may be an insulating material. For example, the inner layer 115 of each pillar 113 may include silicon oxide. In a region between the first and second doping regions 311 and 312, an insulation layer 116 may be provided along an exposed surface of the substrate 11, the insulating materials 112 and the pillars 113. For example, the thickness of the insulation layer 116 may be less than half a distance between the insulating materials 112. A region where a material other than the insulating materials 112 and the insulation layer 116 may be disposed, may be provided between an insulation layer 116 on a lower surface of the first insulating material among the insulating materials 112 and an insulation layer 116 on an upper surface of the second insulating material and at the lower portion of the first insulating material.

In the region between the first and second doping regions 311 and 312, conductive materials 211-291 may be on an exposed surface of the insulation layer 116. For example, the conductive material 211 extending in the first direction may be between the substrate 111 and the insulating material 112 adjacent to the substrate 111. The conductive material 211 extending in the first direction may be between the substrate 111 and the insulation layer 116 on the lower surface of the insulating material 112 adjacent to the substrate 111. A conductive material extending in the first direction may be between the insulation layer 116 of an upper surface of a specific insulating material among the insulating materials 112 and the insulation layer 116 of a lower surface of an insulating material at the upper portion of the specific insulating material.

The conductive materials 221-281 extending in the first direction may be between the insulating materials 112. The first conductive materials 211-291 may be, for example, metal materials. The conductive materials 211-291 may be, for example, polysilicon. The same structure as the first and second doping regions 311 and 312 may be provided between the second and third doping regions 312 and 313. Between the second and third doping regions 312 and 313, there may be insulating materials 112 extending in the first direction, the pillars 113 sequentially disposed in the first direction and passing through the insulating materials 112 in the third direction, the insulation layer 116 on the insulating materials 112 and exposed surfaces of the pillars 113, and the conductive materials 212-292, extending in the first direction.

The same structure as a structure on the first and second doping regions 311 and 312 may be provided between the third and fourth doping regions 313 and 314. Between the third and fourth doping regions 313 and 314, there may be insulating materials 112 extending in the first direction, the pillars 113 sequentially disposed in the first direction and passing through the insulating materials 112 in the third direction, the insulation layer 116 on the insulating materials 112 and the exposed surfaces of the pillars 113, and the conductive materials 213-293 extending in the first direction.

Drains 320 may be provided on the pillars 113, respectively. Exemplarily, the drains 320 may be silicon materials that are doped in a second type. For example, the drains 320 may be silicon materials that are n-type. It may be assumed for purposes of explanation that the drains 320 include n-type silicon. However, the drains 320 are not limited thereto. The width of each of the drains 320 may be greater than that of a corresponding pillar 113. For example, each drain 320 may be provided in a pad shape on the upper surface of a corresponding pillar 113.

Conductive materials 331-333 extending in the third direction may be provided on the drains 320. The conductive materials 331-333 may be sequentially disposed in the first direction. The conductive materials 331-333 may be connected to the drains 320 of corresponding regions, respectively. The drains 320 and the conductive material extending in the third direction may be connected through contact plugs (not shown). The conductive materials 331-333 extending in the third direction may be, for example, metal materials. The conductive materials 331-333 may be, for example, polysilicon.

In FIGS. 2 and 3, each pillar 113 may form a string together with adjacent ones among conductive lines 211-291, 212-292 and 213-293 extending in the first direction. For example, each pillar 113 may form a string ST together with adjacent ones among conductive lines 211-291, 212-292 and 213-293 extending in the first direction. The string ST may include a plurality of transistor structures ST.

Figure 4:
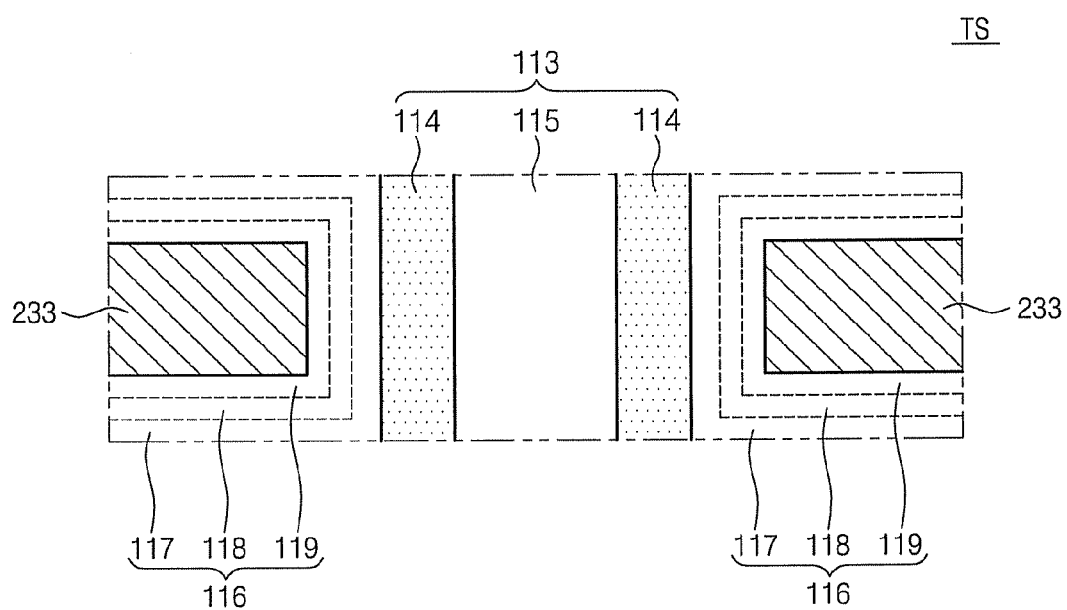

FIG. 4 is a cross-sectional diagram of a transistor structure ST illustrated in FIG. 3. Referring to FIGS. 2-4, an insulation layer 116 may include the first to third sub-insulation layers 117-119. P-type silicon 114 of the pillar 113 may act as a body. The first sub-insulation layer 117 adjacent to a pillar 113 may act as a tunnel insulation film. For example, the first sub-insulation layer 117 adjacent to a pillar 113 may include a thermal oxide layer. The second sub-insulation layer 118 may serve as a charge storage layer. For example, the second sub-insulation layer 118 may serve as a charge trap layer. For example, the second sub-insulation layer 118 may include a nitride layer and/or metal oxide layer (e.g., an aluminum oxide layer and/or a hafnium oxide layer).

The third sub-insulating layer 119 adjacent to the conductive material 233 may serve as a blocking insulation layer. The third sub-insulation layer 119 adjacent to the conductive material 233 extending in the first direction may be formed as a single layer or a multi-layer. The third sub-insulation layer 119 may be a high dielectric layer (e.g., an aluminum oxide layer and/or a hafnium oxide layer) having a higher dielectric constant than the first and second sub-insulation layers 117 and 118. The conductive material 233 may serve as a gate (or a control gate). The gate (or, control gate) 233, the blocking insulation layer 119, the charge storage layer 118, the tunneling insulation layer 117, and the body 114 may form a transistor (or, a memory cell transistor structure). The first to third sub-insulation layers 117-119 may form oxide-nitride-oxide (ONO). The p-type silicon 114 of the pillar 113 may be called the second direction body.

A memory block BLKi may include a plurality of pillars 113. The memory block BLKi may include a plurality of strings ST. The memory block BLKi may include a plurality of strings ST extending in the second direction (or a direction vertical to the substrate). Each string ST may include a plurality of transistor structures ST disposed in the second direction. At least one of the transistor structures ST of each string ST may serve as a string selection transistor SST. At least one of the transistor structures ST of each string ST may serve as a ground selection transistor GST.

Gates (or control gates) may correspond to the conductive materials 211-291, 212-292 and 213-293 extending in the first direction. The gates (or the control gates) may extend in the first direction and form word lines and at least two selection lines (e.g., at least one string selection line SSL and at least one ground selection line GSL). The conductive materials 331-333 extending in the third direction may be connected to one end of the strings ST, respectively. The conductive materials 331-333 extending in the third direction may serve as bit lines BL. In one memory block BLKi, a plurality of strings may be connected to one bit line BL.

Second-type doping regions 311-314 extending in the first direction may be provided to other ends of the strings ST, respectively. The second-type doping regions 311-314 extending in the first direction may serve as the common source line CSL. To sum up the above-described, the memory block BLKi may include a plurality of strings extending in a direction (e.g., the second direction) vertical to the substrate 111, and may serve as a flash memory block (e.g., a charge trapping type) where the plurality of strings ST may be connected to one bit line BL.

FIGS. 2-4 are described assuming the conductive lines 211-291, 212-292 and 213-293 are formed in nine layers. However, the layer number of the conductive lines 211-291, 212-292 and 213-293 extending in the first direction are not limited thereto. For example, the conductive lines may be formed in eight layers, sixteen layers, or more layers. One string may include 8, 16, or more transistors. FIGS. 2-4 are described under the assumption that three strings ST may be connected to one bit line BL. The inventive concept may not be limited thereto. The memory block BLKi may be formed such that m strings ST are connected to one bit line BL. The number of conductive materials 211-291, 212-292 and 213-293 extending in the first direction and the number of common source lines 311-314 may be determined in proportion to the number of strings ST connected to one bit line BL.

FIGS. 2-4 are described under the assumption that three strings ST may be connected to one conductive material extending in the first direction. It is well understood that example embodiments of the inventive concepts are not limited thereto. For example, n strings ST may be connected to one conductive material. The number of bit lines may be determined in proportion to the number of strings ST that may be connected to one conductive material extending in the first direction.

Figure 5:
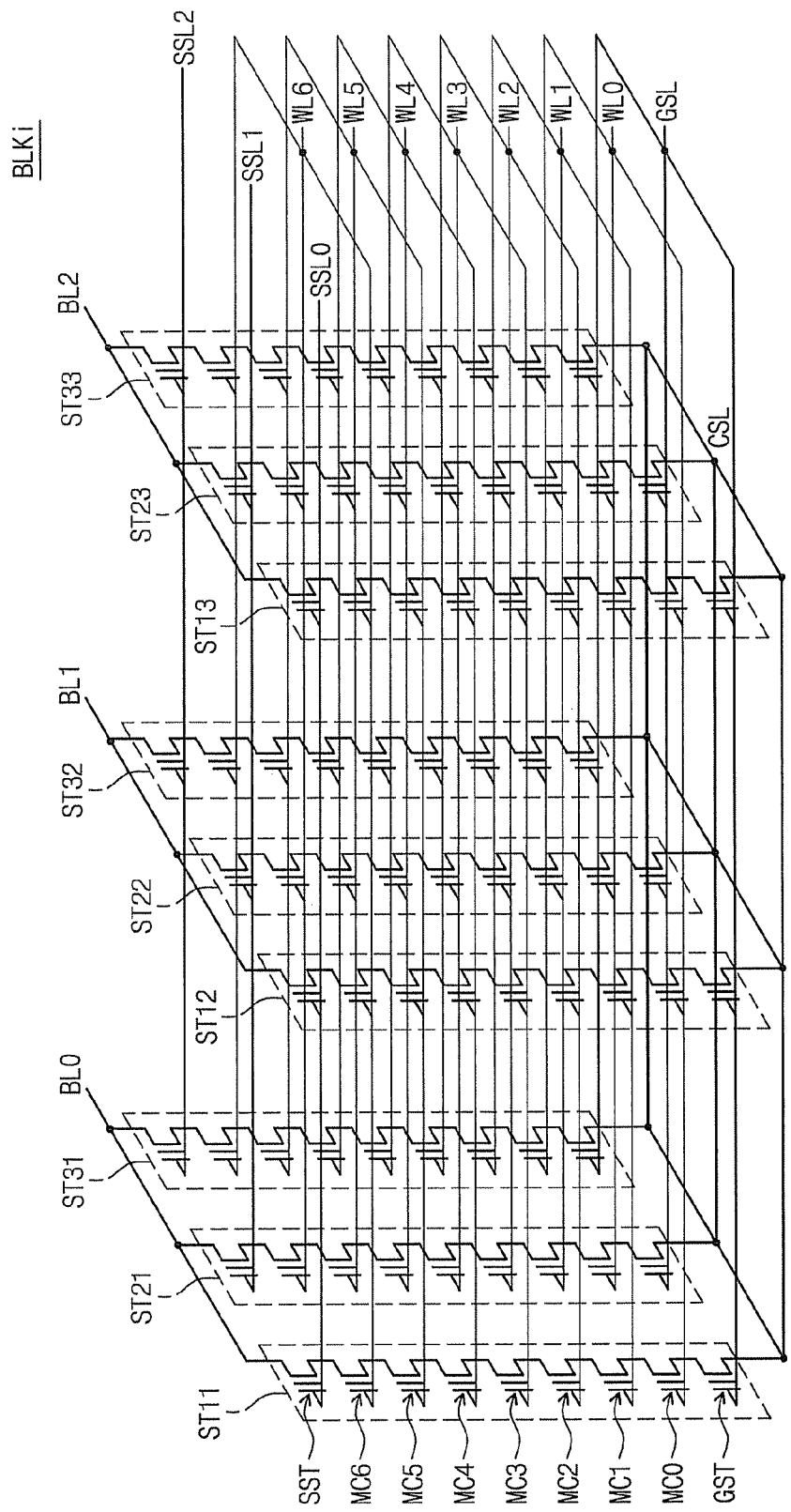

FIG. 5 is an equivalent circuit diagram of a memory block illustrated in FIGS. 2-4. Referring to FIGS. 2-5, strings ST11, ST21 and ST31 may be between the first bit line BL0 and a common source line CSL. The first bit line BL0 may correspond to a conductive material 331 extending in the third direction. Strings ST12, ST22 and ST32 may be between the second bit line BL1 and the common source line CSL. The second bit line BL1 may correspond to a conductive material 332 extending in the third direction. Strings ST13, ST23 and ST33 may be between the third bit line BL2 and the common source line CSL. The third bit line BL2 may correspond to a conductive material 333 extending in the third direction.

A string selection transistor SST of each string ST may be connected to a corresponding bit line BL. A ground selection transistor GST of each string ST may be connected to the common source line CSL. In each string ST, memory cells MC may be between the string selection transistor SST and the ground selection transistor GST. Strings ST may be defined by the row and by the column. The strings ST connected to one bit line in common may form one column. For example, the strings ST11-ST31 connected to the first bit line BL0 may correspond to the first column. The strings ST12-ST32 connected to the second bit line BL1 may correspond to the second column. The strings ST13-ST33 connected to the third bit line BL2 may correspond to the third column.

The strings connected to one string selection line SSL may form one row. For example, the strings ST11-ST13 connected to the first string selection line SSL0 may form the first row. The strings ST21-ST23 connected to the second string selection line SSL1 may form the second row. The strings ST31-ST33 connected to the third string selection line SSL2 may form the third row. In each string ST, a height may be defined. In each string ST, a memory cell MC1 adjacent to the ground selection transistor GST may be defined to have a height of 1. In each string ST, a height of a memory cell may increase as it becomes close to the string selection transistor SST. In each string ST, a memory cell MC7 (not shown) adjacent to the string selection transistor SST may be defined to have a height of 7.

Strings ST in the same row may share a string selection line SSL. Strings ST in different rows may be connected with different sting selection lines SSL0, SSL1 and SSL2. In each string in the same row, memory cells with the same height may share a word line WL. Word lines WL connected with memory cells MC of strings ST placed in different rows and having the same height may be connected in common. According to at least one example embodiment, word lines WL may be connected in common at a layer where conductive materials 211-291, 212-292, and 213-293 extending in the first direction are provided. For example, the conductive materials 211-291, 212-292, and 213-293 extending in the first direction may be connected at an upper layer via contacts. The conductive materials 211-291, 212-292, and 213-293 extending in the first direction may be connected in common at the upper layer.

Strings ST in the same row may share a ground selection line GSL. Strings ST in different rows may share a ground selection line GSL. For example, strings ST11-ST13, ST21-ST23 and ST31ST33 may be connected in common with the ground selection line GSL. The common source line CSL may be connected to strings ST in common. For example, the first to fourth doping regions 311-314 may be connected at an active region on the substrate 111. The first to fourth doping regions 311 to 314 may be connected to an upper layer via contacts so as to be connected in common at the upper layer.

As illustrated in FIG. 5, the word lines WL with the same height may be connected in common. When a specific word line WL is selected, all strings ST connected to the specific word line WL may be selected. The strings ST of different rows may be connected to different string selection lines SSL. By selecting the string selection lines SSL0-SSL2, strings ST in an unselected row among strings ST connected to the same word line WL may be separated from bit lines BL0, BL1, and BL2. A row of strings ST may be selected by selecting the string selection lines SSL0-SSL2. Strings in the selected row may be selected by the column by selecting the bit lines BL0-BL2.

According to at least one example embodiment, at programming and reading, one of string selection lines SSL0-SSL2 may be selected. Programming and reading may be carried out by the row of strings ST11-ST13, ST21-ST23 and ST31-ST33. According to at least one example embodiment, at programming and reading, a selection voltage may be applied to a selected word line in a selected row and a non-selection voltage may be applied to unselected word lines. For example, the selection voltage may be a program voltage Vpgm or a read voltage Vr. For example, the non-selection voltage may be a pass voltage Vpass or a non-selection read voltage Vread. Programming and reading may be performed by the word line of a selected row of strings ST11-ST13, ST21-ST23 and ST31-ST33.

According to at least one example embodiment, a first voltage may be applied to a bit line corresponding to a memory cell to be programmed. A second voltage may be applied to a bit line corresponding to a program inhibited memory cell. A bit line corresponding to a memory cell to be programmed may be called a selected bit line, and a bit line corresponding to a program inhibited memory cell may be called an unselected bit line. It is assumed for purposes of explanation that strings ST11-ST13, ST21-ST23 and ST31-ST33 in the first row may be selected at programming. It is assumed that the second bit line BL1 may be selected and the first and third bit lines BL0 and BL2 may be unselected.

Figure 6:
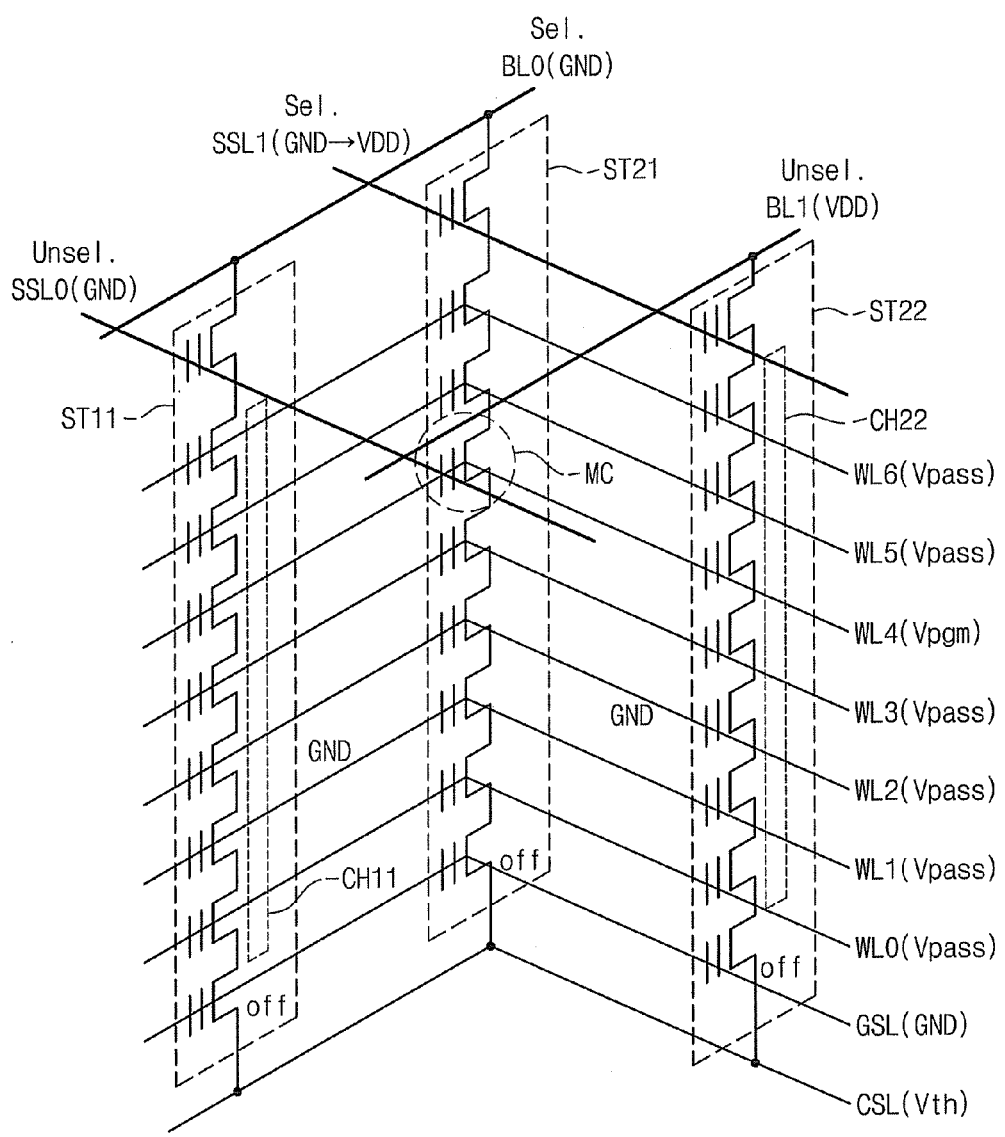

FIG. 6 is a schematic diagram showing a bias condition of a program operation according to example embodiments of the inventive concepts. Referring to FIG. 6, a bias condition of a program operation on a memory cell MC connected with a word line WL4 and a bit line BL0 may be as follows. A string ST21 including a memory cell MC being programmed may be referred to as a program string, and strings ST11 and ST22 not including a memory cell being programmed may be referred to as inhibit strings. A ground voltage GND may be applied to string selection lines SSL0 and SSL1 and a ground selection line GSL. This may float the inhibit strings ST11 and ST22. Channels CH11 and CH22 of the inhibit strings ST11 and ST22 may have an initial voltage of a ground voltage GND.

At, for example, the same time, a bit line program voltage (e.g., a ground voltage: GND) may be applied to a selected bit line BL0, and a bit line program inhibit voltage (e.g., a power supply voltage: VDD) may be applied to an unselected bit line BL1. The bit lines BL0 and BL1 may be set up. Afterward, a power supply voltage VDD may be applied to a selected string selection line SSL1, a pass voltage Vpass may be applied to unselected word lines WL0, WL1, WL2, WL3, WL5, and WL6 and a program voltage Vpgm may be applied to a selected word line WL4. According to this bias condition, channels of the inhibit strings ST11 and ST22 may be boosted, and the memory cell MC of the program string ST21 may be programmed. According to at least one example embodiment, the program voltage Vpgm may be applied to the selected word line WL4 after the pass voltage Vpass may be applied to the selected word line WL4 during a period of time.

A program voltage applying method according to at least one example embodiment of the inventive concepts may include boosting channels after channels CH11 and CH22 of the inhibit strings ST11 and ST22 may be reset to a ground voltage GND. With the program voltage applying method, a bit line setup operation may be performed together with the channel boosting.

Figure 7:
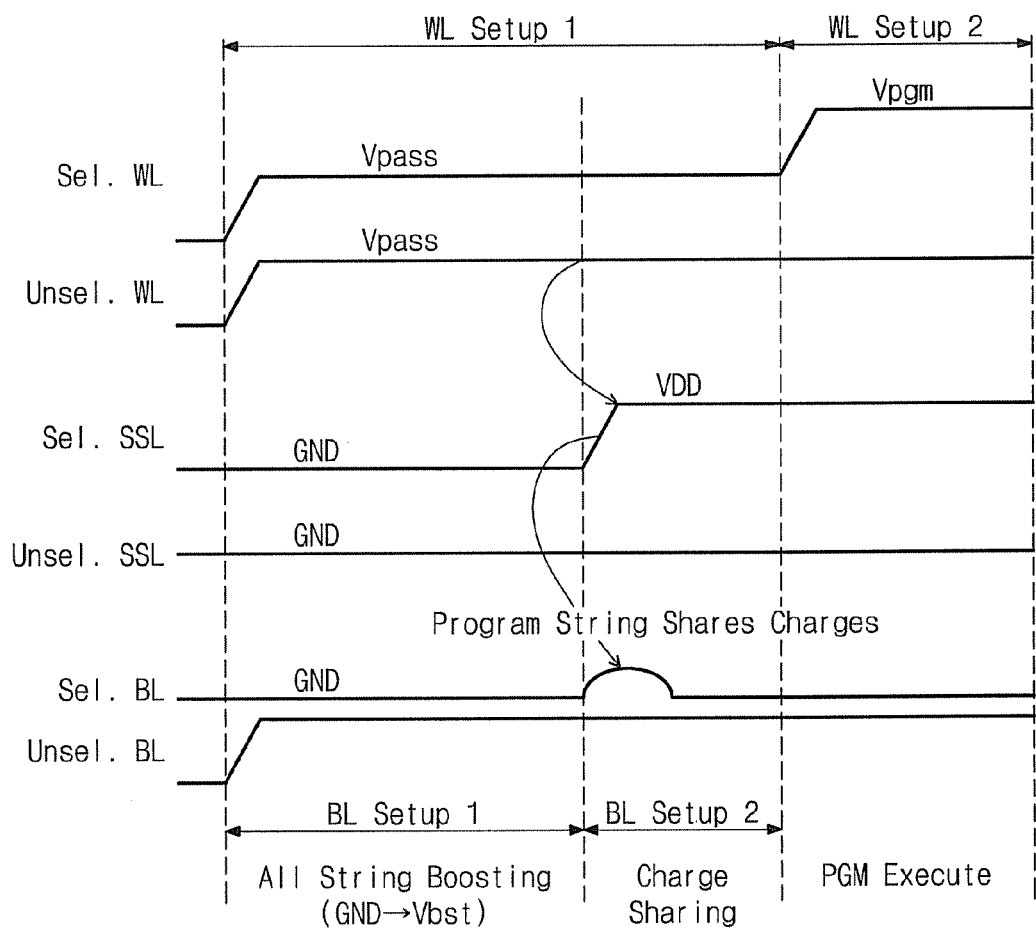

FIG. 7 is a timing diagram of a program operation according to example embodiments of the inventive concepts. Referring to FIGS. 6 and 7, during the first word line setup period WL Setup 1, a pass voltage may be applied to all word lines, that is, selected and unselected word lines. During the second word line setup period WL Setup 2, a program voltage Vpgm may be applied to the selected word line. At this time, the pass voltage Vpass may be continuously applied to the unselected word lines.

During the first bit line setup period BL Setup 1, a ground voltage GND may be applied to selected and unselected string selection lines. During the second bit line setup period BL Setup 2, a power supply voltage VDD may be applied to the selected string selection line, and the unselected string selection line may be continuously supplied with a ground voltage GND. During the first bit line setup period, all strings may be floated, and simultaneously a pass voltage Vpass may be applied to all word lines. At this time, channels of all strings may be boosted. For example, channels of all strings may increase up to a boost voltage Vbst from a ground voltage by the channel boosting.

At the first bit line setup period, a ground voltage GND may be applied to the selected bit line, and a power supply voltage VDD may be applied to the unselected bit line. During the second bit line setup period, the selected bit line may be electrically connected with a channel of a program string, which may be connected with the selected bit line, when a power supply voltage VDD is applied to the selected string selection line. This may make charges corresponding to the boost voltage Vbst be shared by the selected bit line and the program string. Afterwards, a ground voltage GND may be applied to the selected bit line for programming. The second bit line setup operation may be completed. A program execution operation may be made within the second word line setup period.

The program method according to example embodiments of the inventive concepts may include boosting channels of all strings at the first bit line setup period, lowering a boost voltage Vbst of a program string to a ground voltage via charge sharing at the second bit line setup period, and performing a program execution operation.

In FIGS. 6 and 7, all strings may have an initial channel voltage of a ground voltage GND before a channel boosting operation is performed. Example embodiments of the inventive concepts are not limited to this disclosure. All strings may be set to have a channel voltage (e.g., a pre-charge voltage) higher in level than a ground voltage GND before a channel boosting operation may be performed.

Figure 8:
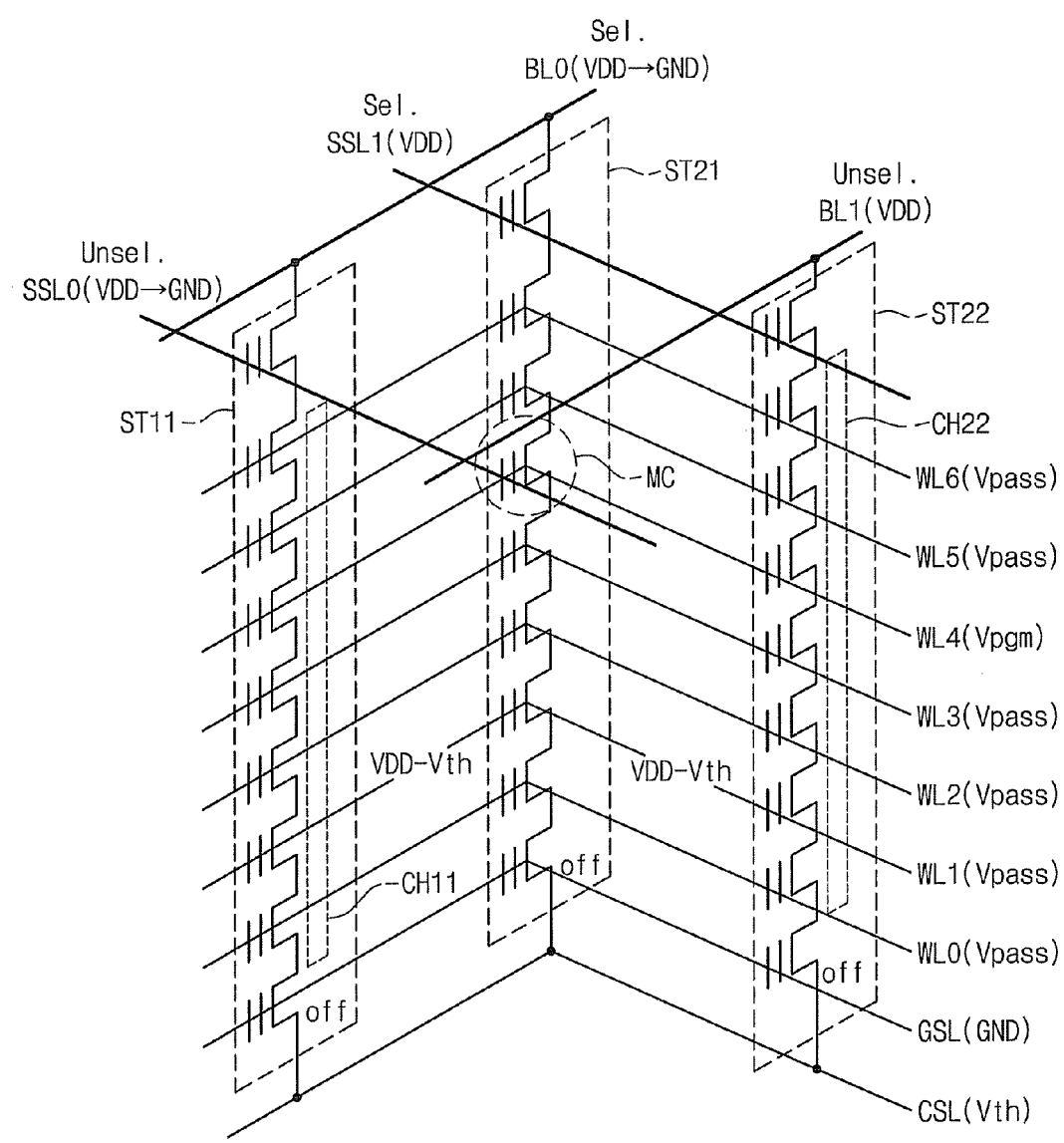

FIG. 8 is a schematic diagram showing a bias condition of a program operation according to other to example embodiments of the inventive concepts. Referring to FIG. 8, a bias condition of a program operation on a memory cell MC connected with a word line WL4 and a bit line BL0 may be as follows. A power supply voltage VDD may be applied to all string selection lines SSL0 and SSL1, and a ground voltage GND may be applied to a ground selection line GSL. At the same time, a pre-charge voltage (e.g., a power supply voltage: VDD) may be applied to all bit lines BL0 and BL1. Under this bias condition, channels of all strings ST11, ST12 and ST22 may be set to a voltage of (VDD-Vth) (Vth being a threshold voltage of a string selection transistor). Afterwards, a ground voltage GND may be applied to an unselected string selection line SSL0 for channel boosting.

A ground voltage GND may be applied to the selected bit line BL0 to set a channel voltage of a program string ST21 to a ground voltage. An inhibit string ST11 may be floated by electrically isolating it from the selected bit line BL0 and a common source line CSL. Floating of an inhibit string ST22 may be accomplished by electrically isolating it from the common source line CSL with a string selection transistor connected with SSL1 being shut off. The inhibit string ST22 may be shut off from the bit line BL1 because a channel CH22 of the inhibit string ST22 is set to a voltage of (VDD-Vth) and a power supply voltage VDD may be applied to the selected string selection line SSL1. Because a string selection transistor connected with SSL1 and BL1 may be shut off, the inhibit string ST22 may be floated.

Afterwards, channels of the floated inhibit strings ST11 and ST22 may be boosted by applying a pass voltage Vpass to unselected word lines WL0-WL3, WL5 and WL6 and a program voltage Vpgm to a selected word line WL4. At the same time, the memory cell MC in the program string ST21 may be programmed. According to at least one example embodiment, a program voltage Vpgm may be applied to a selected word line after a pass voltage Vpass may be applied thereto during a period of time. A program voltage applying method according to example embodiments of the inventive concepts may include boosting channels after channels CH11 and CH22 of the inhibit strings ST11 and ST22 are set to a pre-charge voltage (VDD-Vth). With the program voltage applying method, a bit line setup operation may be performed together with the channel boosting.

Figure 9:
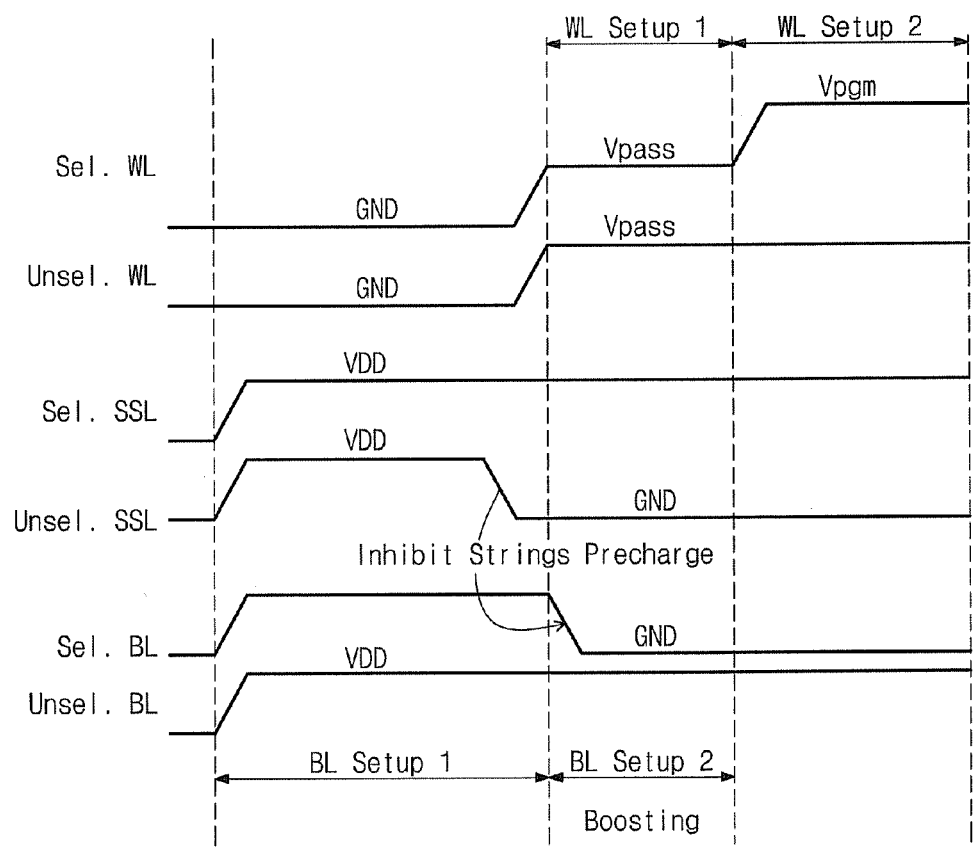

FIG. 9 is a timing diagram of a program operation according to other example embodiments of the inventive concepts. Referring to FIGS. 8 and 9, during the first word line setup period WL Setup 1, a pass voltage may be applied to all word lines, that is, selected and unselected word lines. During the second word line setup period WL Setup 2, a program voltage Vpgm may be applied to the selected word line. At this time, the pass voltage Vpass may be continuously applied to the unselected word lines. At the first bit line setup period BL setup 1, a power supply voltage VDD may be applied to selected and unselected string selection lines and to selected and unselected bit lines. With this bias condition, channels of all strings may be pre-charged by a voltage of (VDD-Vth). At this time, strings connected with the selected string selection line may be shut off from bit lines. The strings connected with the selected string selection line may be floated.

During the second bit line setup period BL Setup 2, the selected string selection line may be maintained with a power supply voltage VDD, and a ground voltage may be applied to the unselected string selection line. According to at least one example embodiment, a ground voltage GND may be applied to the unselected string selection line prior to the second bit line setup period. An inhibit string may be electrically blocked from a bit line. The inhibit string may be floated. During the second bit line setup period, a ground voltage GND may be applied to the selected bit line, and the unselected bit line may be maintained with the power supply voltage VDD. A ground voltage GND may be applied to the selected bit line in synchronization with setting of the unselected string selection line to a ground voltage GND.

As illustrated in FIG. 9, channels of floated inhibit strings may be boosted by applying a pass voltage Vpass to all word lines at the second bit line setup period. Afterwards, a program execution operation may be performed within the second word line setup period. A program method according to at least one example embodiment of the inventive concepts may include setting channels of all strings to a pre-charge voltage during the first bit line setup period and boosting channels during the second bit line setup period. It may be possible to set initial channel voltages of inhibit strings to the same voltage level.

Figure 10:
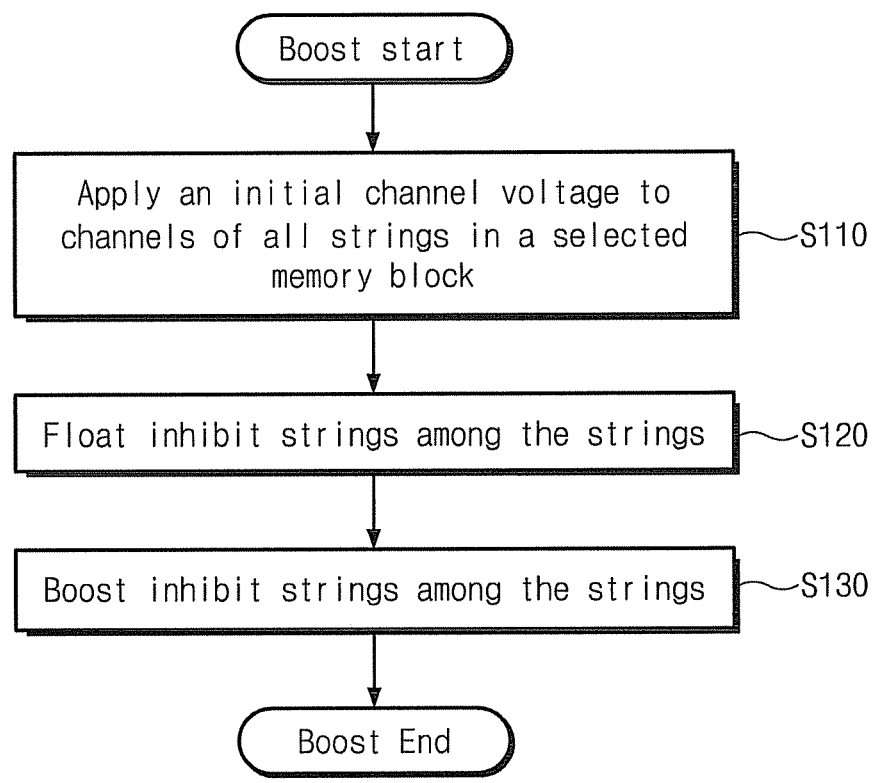

FIG. 10 is a flowchart of channel boosting methods of non-volatile memory devices according to example embodiments of the inventive concepts. Referring to FIGS. 1-10, in operation S110, an initial channel voltage may be applied to channels of all strings within a selected memory block. The initial channel voltage may be a ground voltage or a pre-charge voltage. The initial channel voltage may be applied to channels of strings via corresponding bit lines. In operation S120, inhibit strings among all strings may be floated. According to at least one example embodiment, program strings may be floated. In operation S130, channels of the floated inhibit strings may be boosted by applying a pass voltage to unselected word lines. Channels of all inhibit strings may be boosted from an initial channel voltage. Channels of all inhibit strings may be boosted under the same initial condition.

Figure 11:
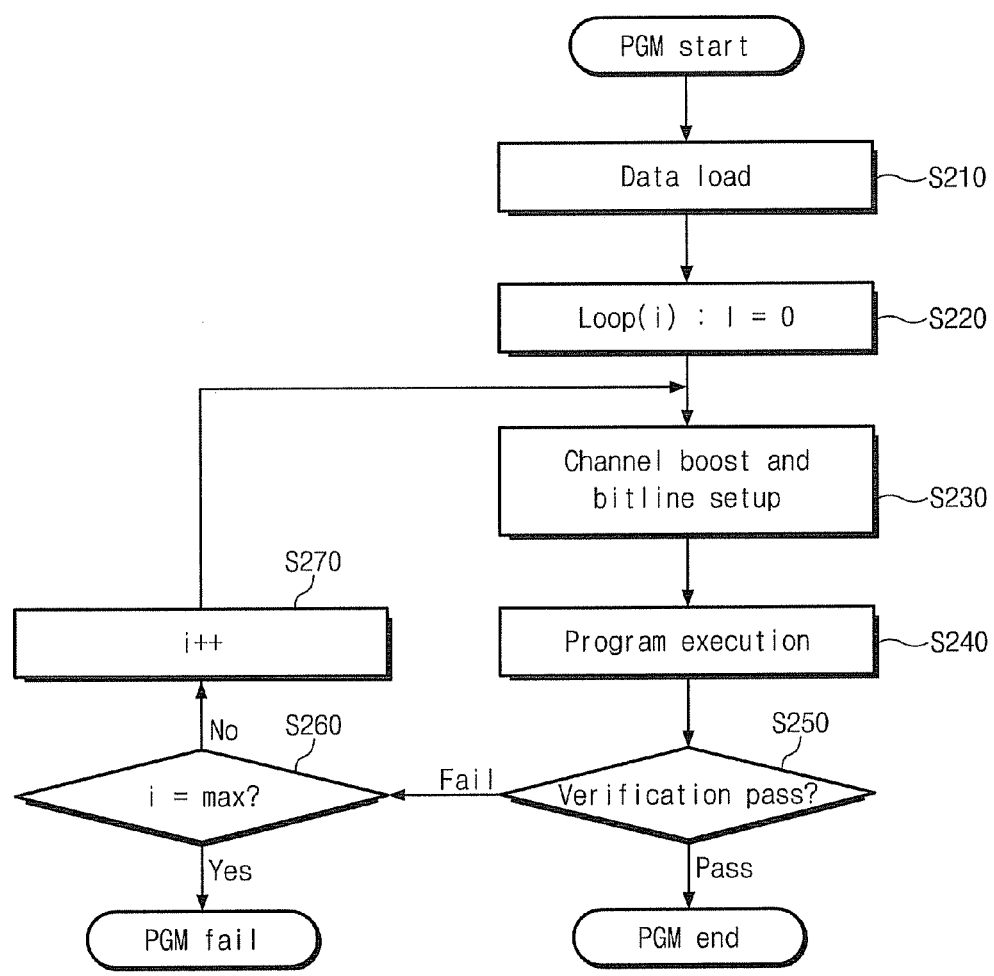

FIG. 11 is a flowchart of program methods of non-volatile memory devices according to example embodiments of the inventive concepts. Referring to FIGS. 1-11, in operation S210, data to be programmed at a program operation may be loaded onto a read and write circuit 130 via a data input/output circuit 140. A voltage generator (not shown) may generate bias voltages (e.g., a program voltage, a pass voltage, a high voltage, a well voltage and/or a verification read voltage) needed for the program operation according to the control of control logic 150. In operation S220, the control logic 150 may set a value (i) indicating a program loop such that the first program loop is executed.

In operation S330, bit lines may be set up according to the loaded data in the read and write circuit 130 together with channel boosting. According to at least one example embodiment, when the channel boosting may be executed, initial channel voltages of all inhibit strings may be a ground voltage or a pre-charge voltage (VDD-Vth). In operation S240, memory cells may be programmed by applying a pass voltage to unselected word lines and a program voltage to a selected word line. The program voltage may increase stepwise according to iteration of program loops. A pass voltage may be applied to a selected word line for a predetermined time before a program voltage is applied thereto. Afterwards, a program recovery operation may be performed such that bias voltages of word lines, string selection lines, and bit lines may be discharged.

In operation S250, the control logic 150 may perform a verification operation to judge whether a program operation is executed normally. If passed, the program operation may be ended. If failed, the method may proceed to operation S260, in which the control logic 150 judges whether a loop number (i) may be a maximum value. If so, the program operation may be processed as failed. If not, the method may proceed to operation S270, in which the program number (i) may increase by 1. As the loop number (i) may increase, the program voltage may increase by an increment. According to example embodiments of the inventive concepts, a bit line setup operation may be performed together with channel boosting.

Figure 12:
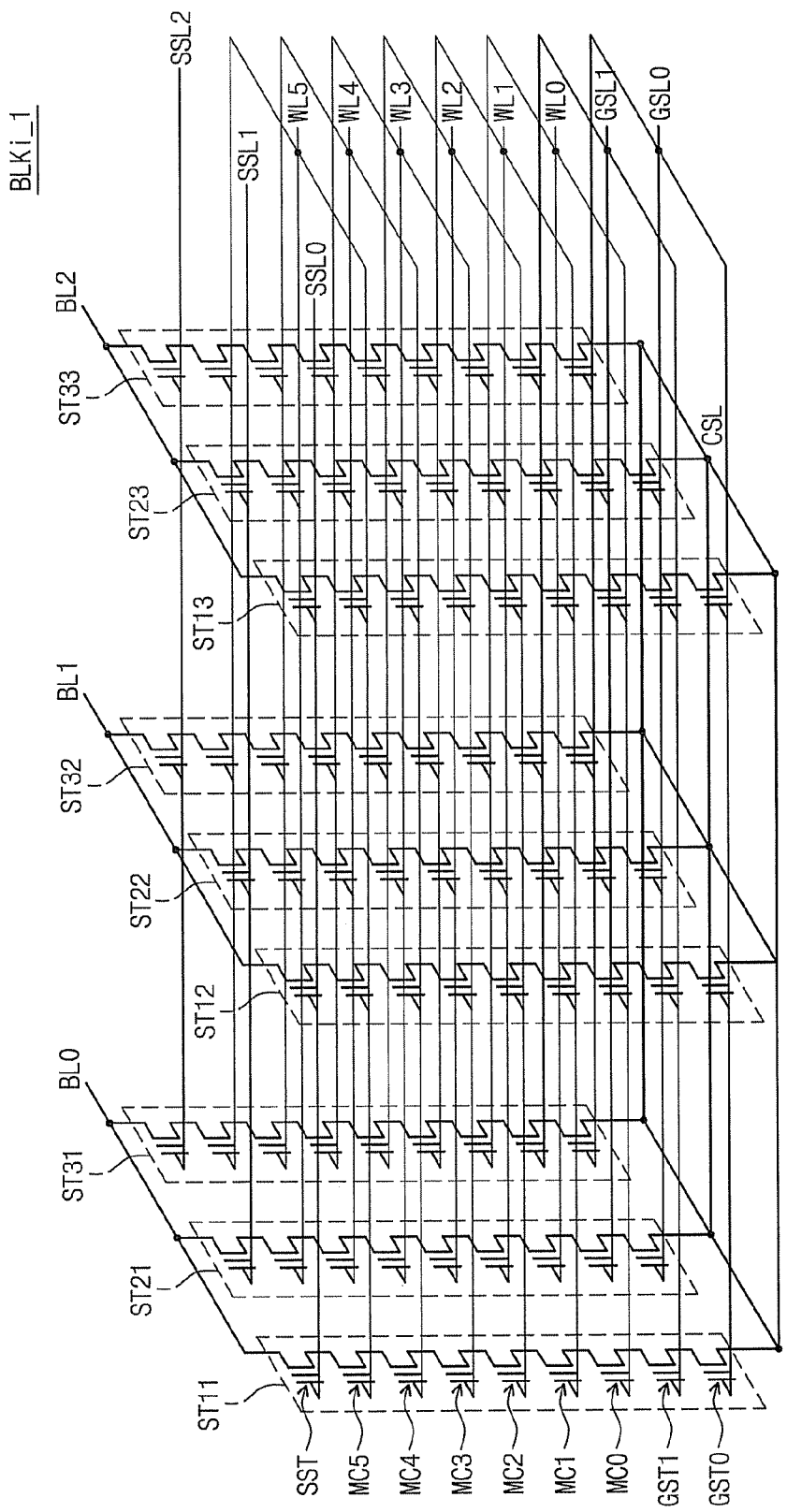

FIG. 12 is an equivalent circuit diagram of a memory block illustrated in FIGS. 1-4 according to example embodiments of the inventive concepts. As compared with a memory block BLKi in FIG. 5, in a memory block BLKi_1 each string ST may include two ground selection transistors GST0 and GST1 placed between memory cells MC0-MC5 and a common source line CSL. Ground selection lines GSL0 or GSL1 corresponding to ground selection transistors GST0 or GST1 at the same height may be connected in common. The ground selection line GSL0 and GSL1 connected with the ground selection transistors GST0 and GST1 within the same string ST may be connected in common.

Figure 13:
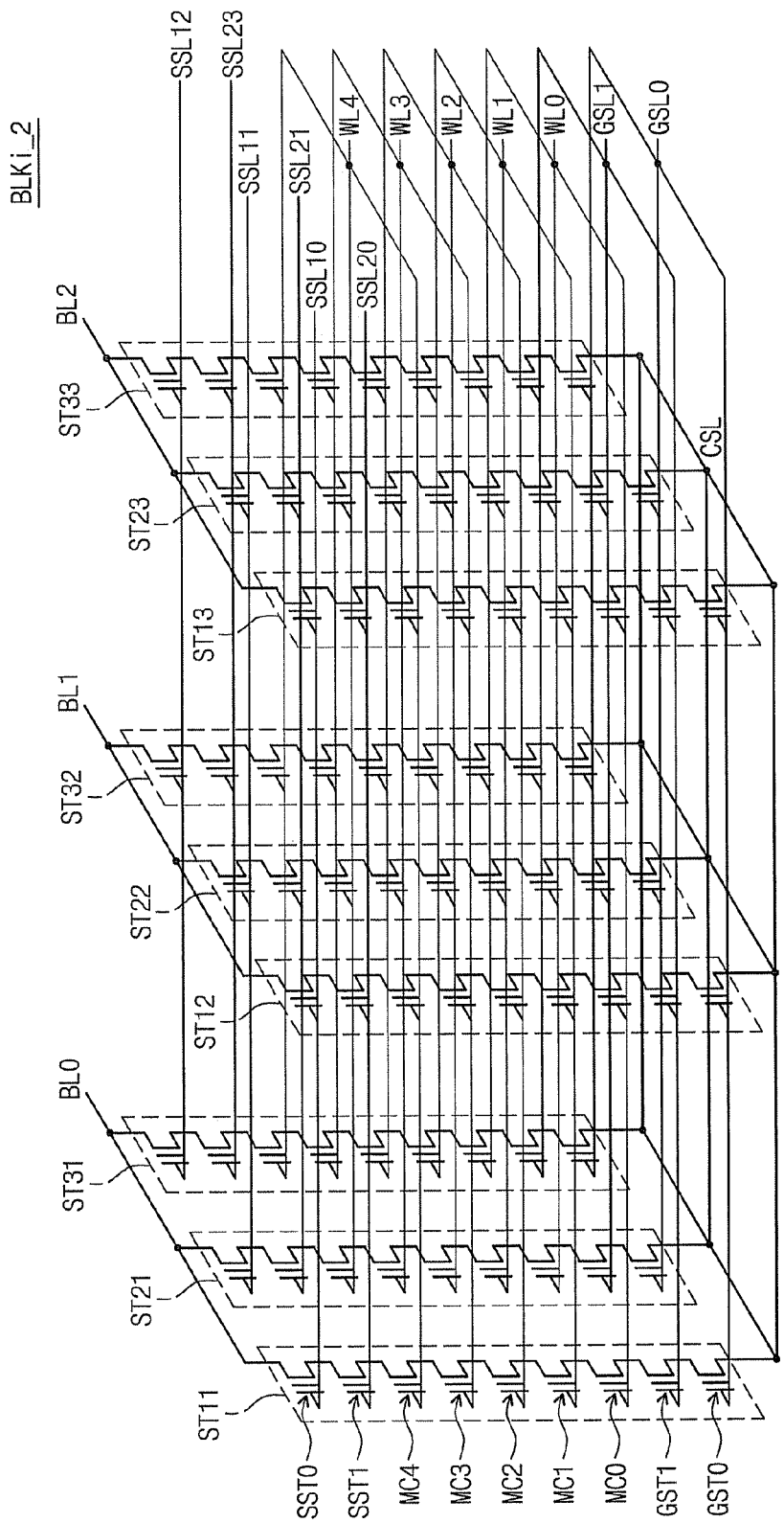
Figure 14:
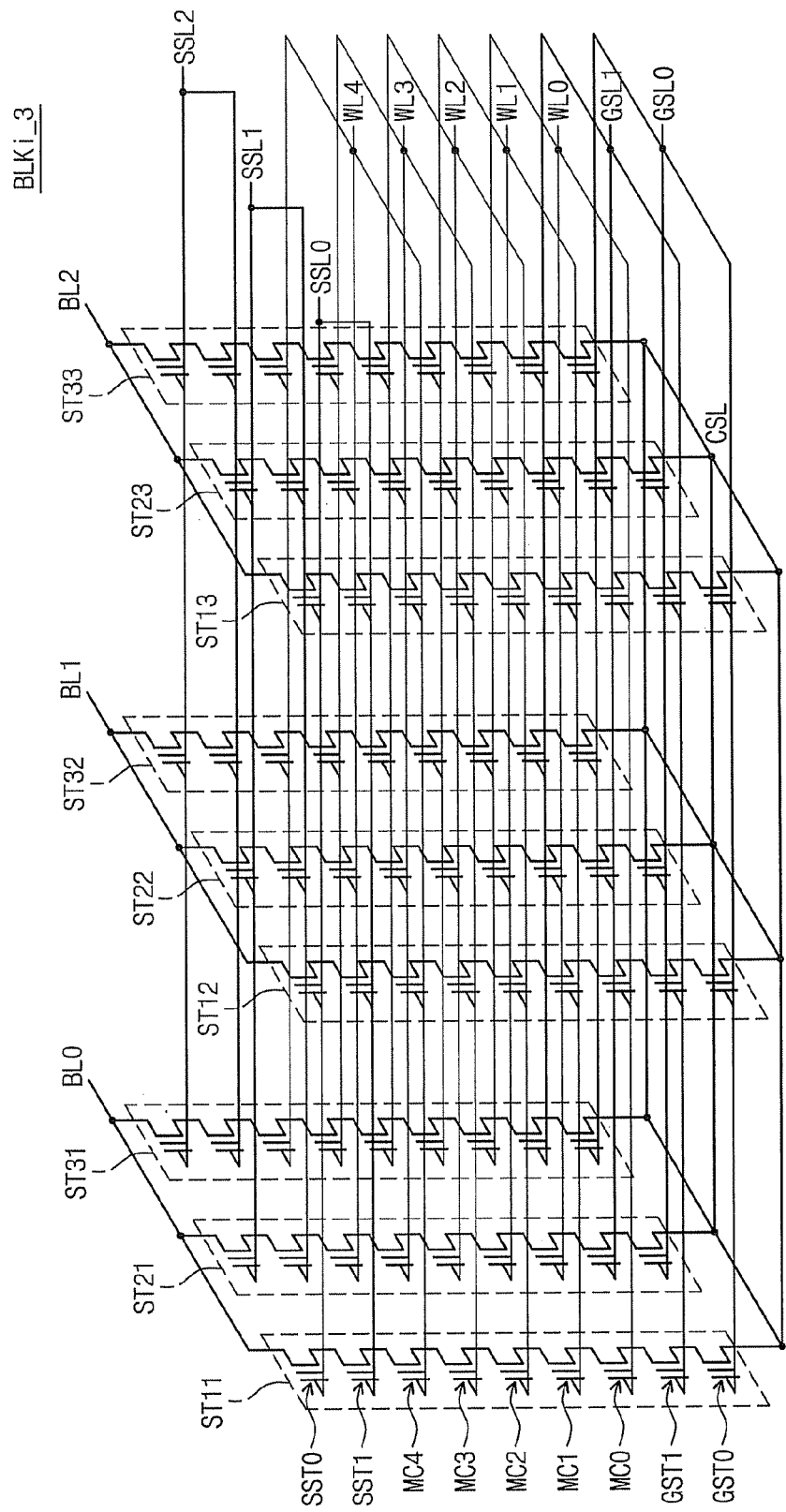

FIG. 13 is an equivalent circuit diagram of a memory block illustrated in FIGS. 1-4 according to still other example embodiments of the inventive concepts. As compared with FIG. 2, in a memory block BLK_2 each string ST may include two string selection transistors SST0 and SST1 placed between memory cells MC0-MC4 and a bit line GL. String selection lines SSL10-SSL23 may be connected to respective string selection transistors SST0 and SST1. FIG. 14 is an equivalent circuit diagram of a memory block illustrated in FIGS. 1-4 according to yet other example embodiments of the inventive concepts. As compared with FIG. 13, in a memory block BLK_3, string selection lines connected with string selection transistors SST0 and SST1 in each string ST may be connected in common.

Figure 15:
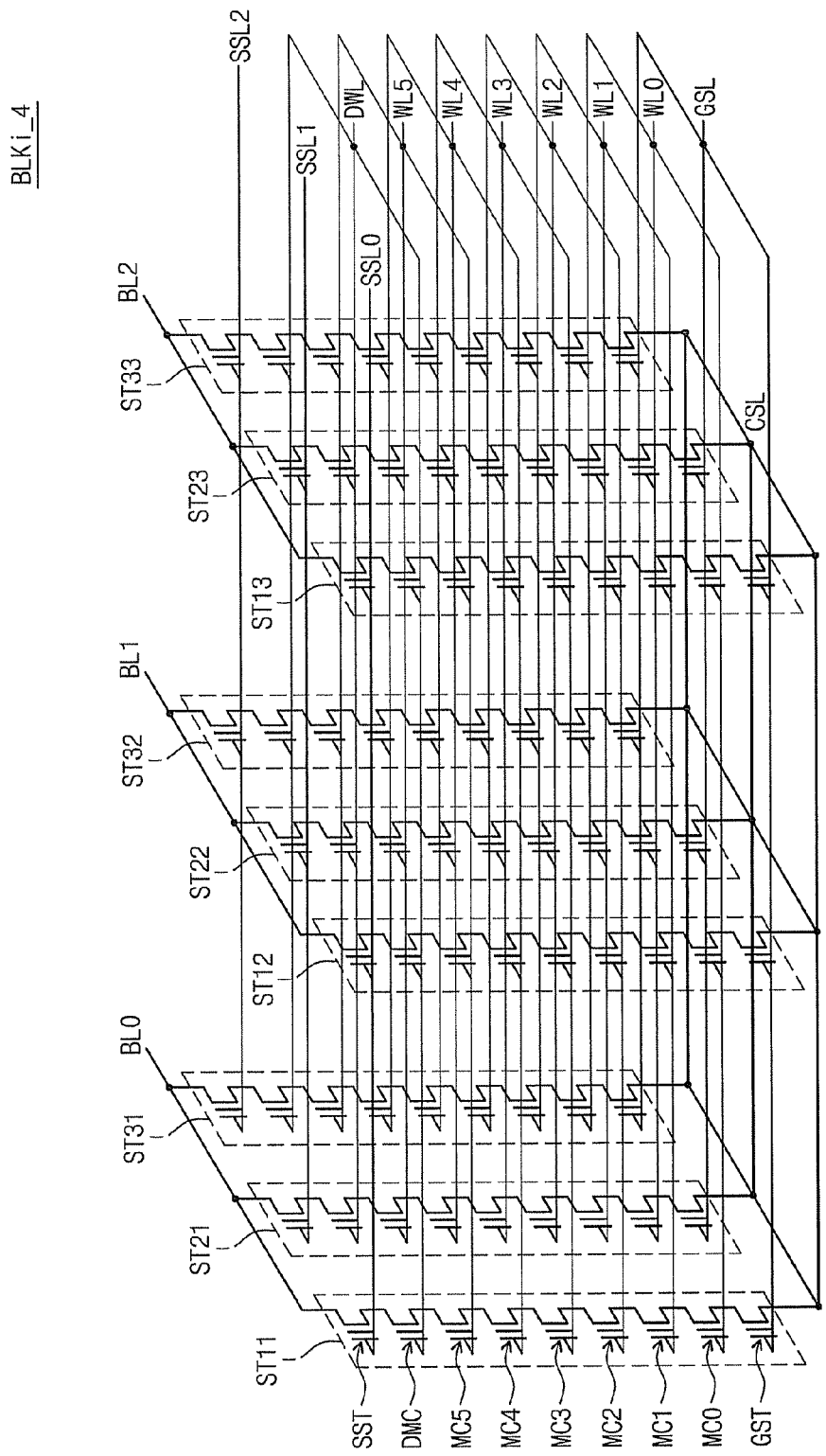

FIG. 15 is an equivalent circuit diagram of a memory block illustrated in FIGS. 1-4 according to further example embodiments of the inventive concepts. As compared with FIG. 5, in a memory block BLKi_4 each string ST may include a dummy memory cell DMC placed between a string selection transistor SST and memory cells MC0-MC5. The dummy memory cells DMC may be connected in common with a dummy word line DWL. The dummy word line DWL may be provided between string selection lines SSL0-SSL2 and word lines WL0-WL5.

Figure 16:
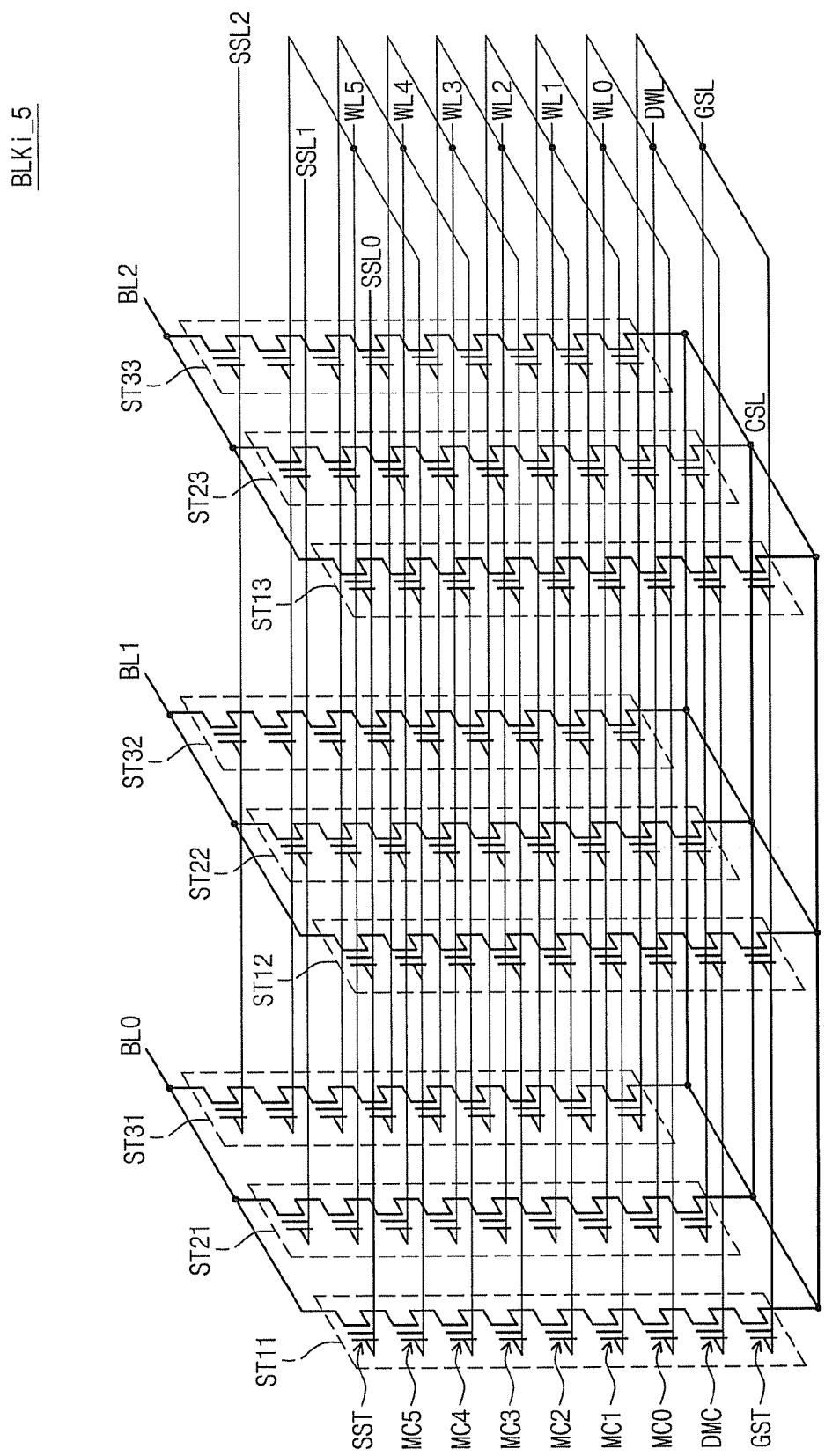
Figure 17:
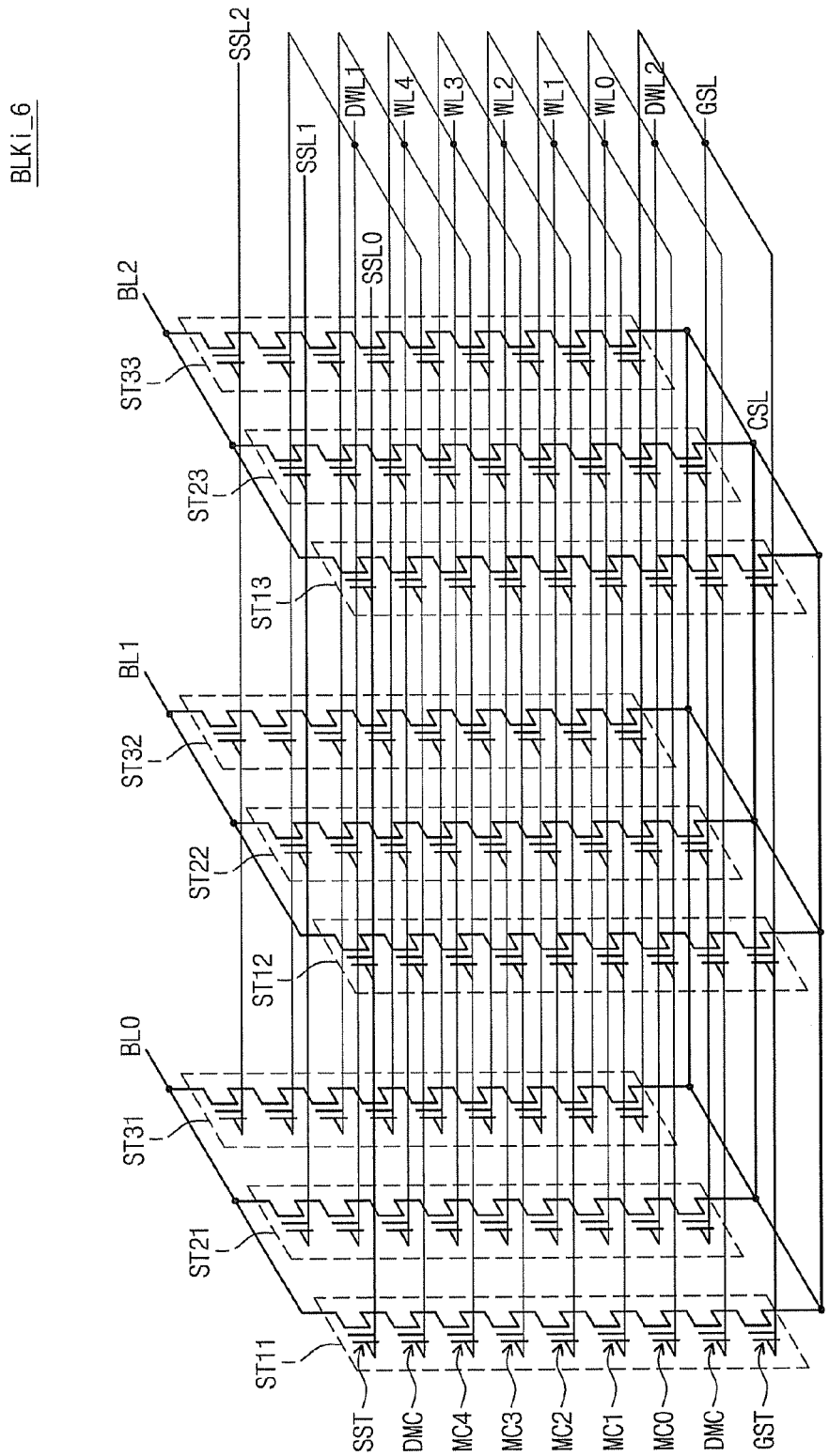

FIG. 16 is an equivalent circuit diagram of a memory block illustrated in FIGS. 1-4 according to still further example embodiments of the inventive concepts. As compared with FIG. 5, in a memory block BLKi_5, each string ST may include a dummy memory cell DMC placed between a ground selection transistor GST and memory cells MC0-MC5. The dummy memory cells DMC may be connected in common with a dummy word line DWL. The dummy word line DWL may be provided between a ground selection line GSL and word lines WL0-WL5. FIG. 17 is an equivalent circuit diagram of a memory block illustrated in FIGS. 1-4 according to yet still other example embodiments of the inventive concepts. As compared with FIG. 5, in a memory block BLKi_6, each string ST may include a dummy memory cell DMC placed between a string selection transistor SST and memory cells MC0-MC4. The dummy memory cells DMC may be connected in common with the first dummy word line DWL1. The first dummy word line DWL1 may be provided between string selection lines SSL0-SSL2 and word lines WL0-WL4. Each string ST may include a dummy memory cell DMC placed between a ground selection transistor GST and memory cells MC0-MC4. The dummy memory cells DMC may be connected in common with the second dummy word line DWL2. The second dummy word line DWL2 may be provided between a ground selection line GSL and word lines WL0-WL4.

Figure 18:
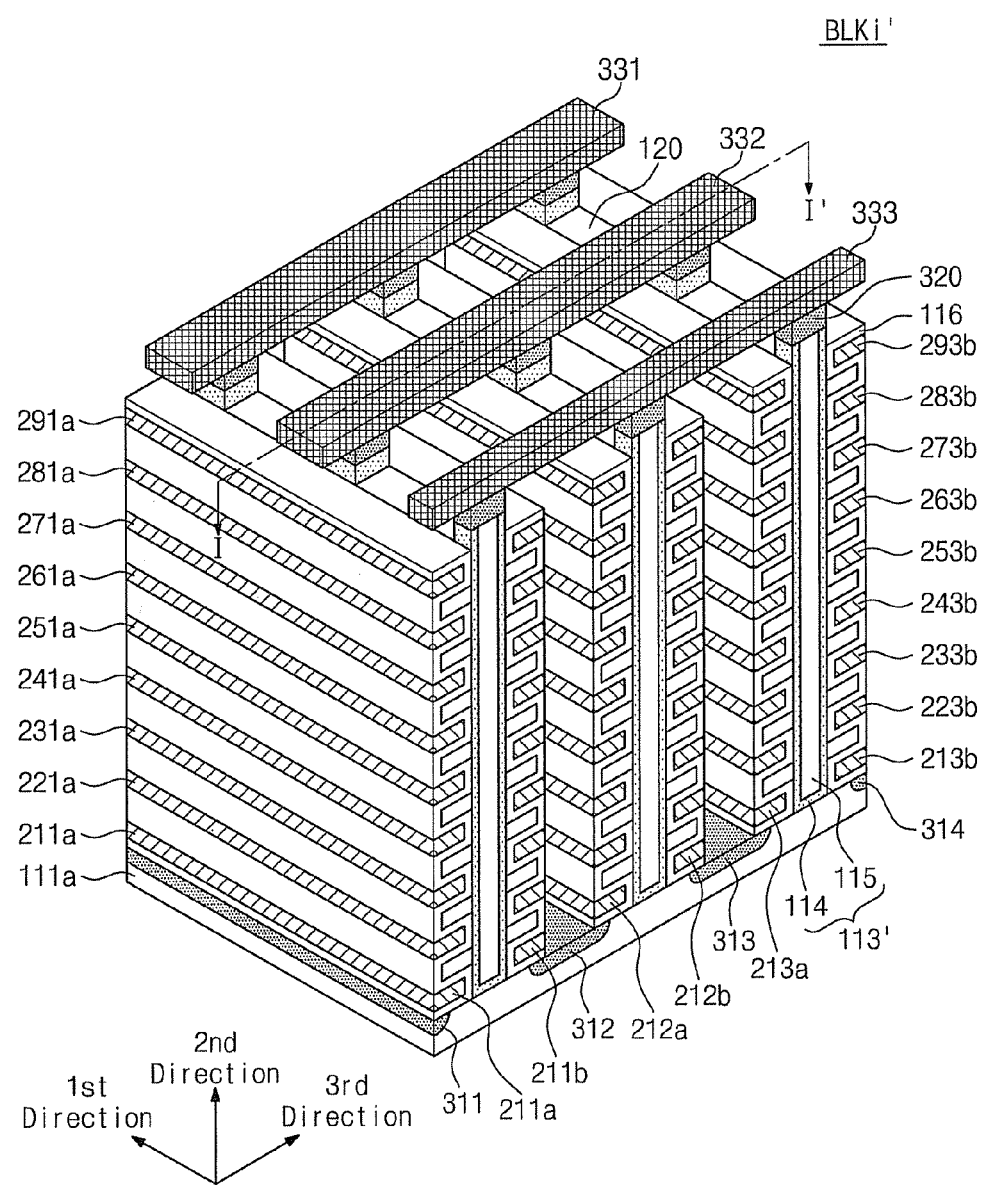

FIG. 18 is a perspective view of one of memory blocks illustrated in FIG. 1 according to other example embodiments of the inventive concepts. As compared with FIG. 2, a memory block BLKi' may include pillars 113' which may be square shaped. Insulation materials 120 may be between pillars 113' disposed in the first direction. According to at least one example embodiment, the insulation materials 120 may extend in the second direction to be connected with a substrate 111a. The insulation materials 120 may extend in the first direction at the remaining area other than an area where the pillars 113' may be provided. Conductive materials 211-291, 212-292, and 213-293 extending in the first direction described in FIG. 2 may be divided into two portions 211a-291a, 211b-291b, 212a-292a, 212b-292b, 213a-293a, and 213b-293b by the insulation materials 120, respectively. The separated portions 211a-291a, 211b-291b, 212a-292a, 212b-292b, 213a-293a and 213b-293b may be isolated electrically.

At a region on the first and second doping regions 311 and 312, each pillar 113' may form one string ST with an insulation film 116 and the portions 211a-291a of the conductive material extending in the first direction, and may form another string ST with the insulation film 116 and the portions 211b-291b of the conductive material extending in the first direction. At a region on the third and fourth doping regions 313 and 314, each pillar 113' may form one string ST with the insulation film 116 and the portions 213a-293a of the conductive material extending in the first direction, and may form another string ST with the insulation film 116 and the portions 213b-293b of the conductive material extending in the first direction. Each pillar 113' may form two strings ST by electrically isolating, for example, conductive materials 211a-291a and 211b-291b, extending in the first direction, provided at both sides of each pillar 113' using the insulation film 120.

Figure 19:
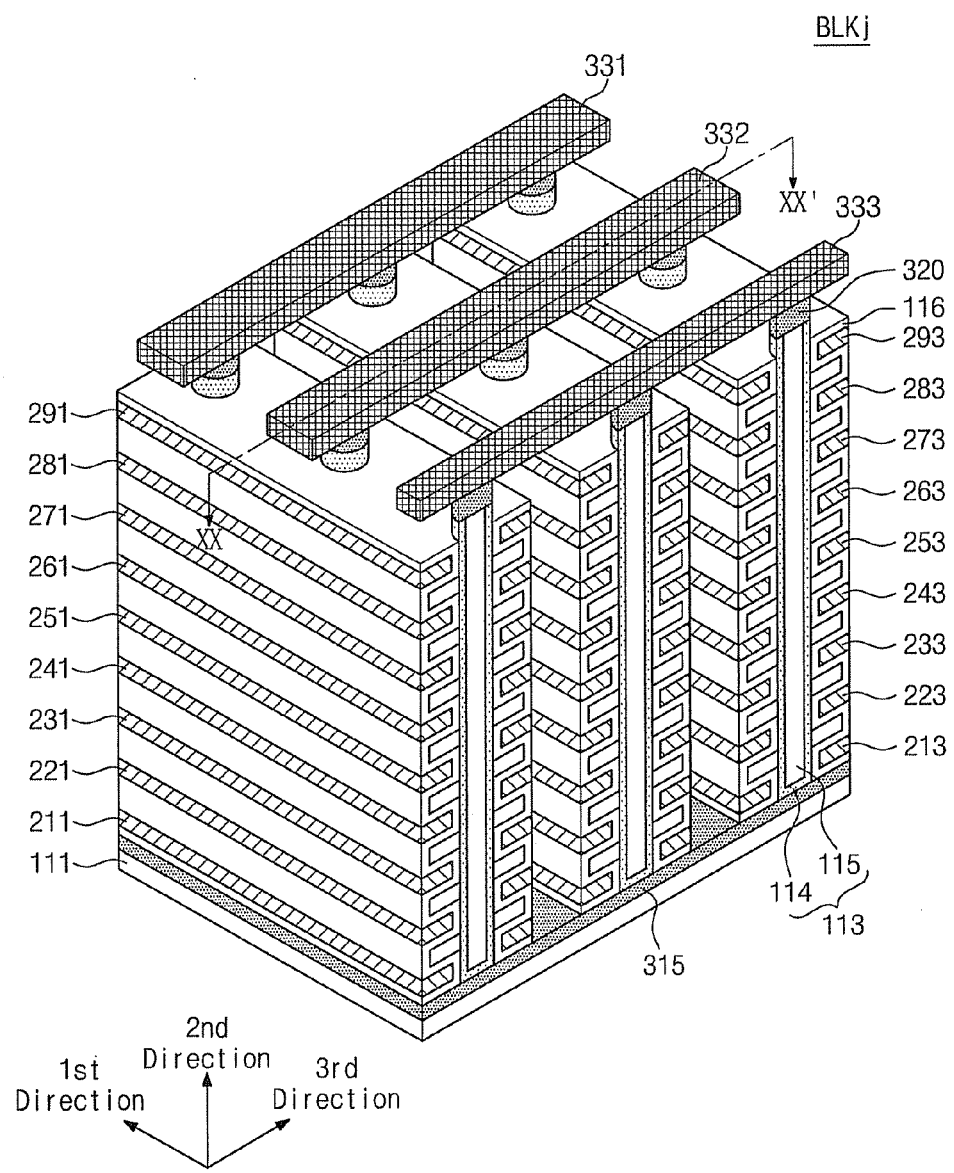
Figure 20:
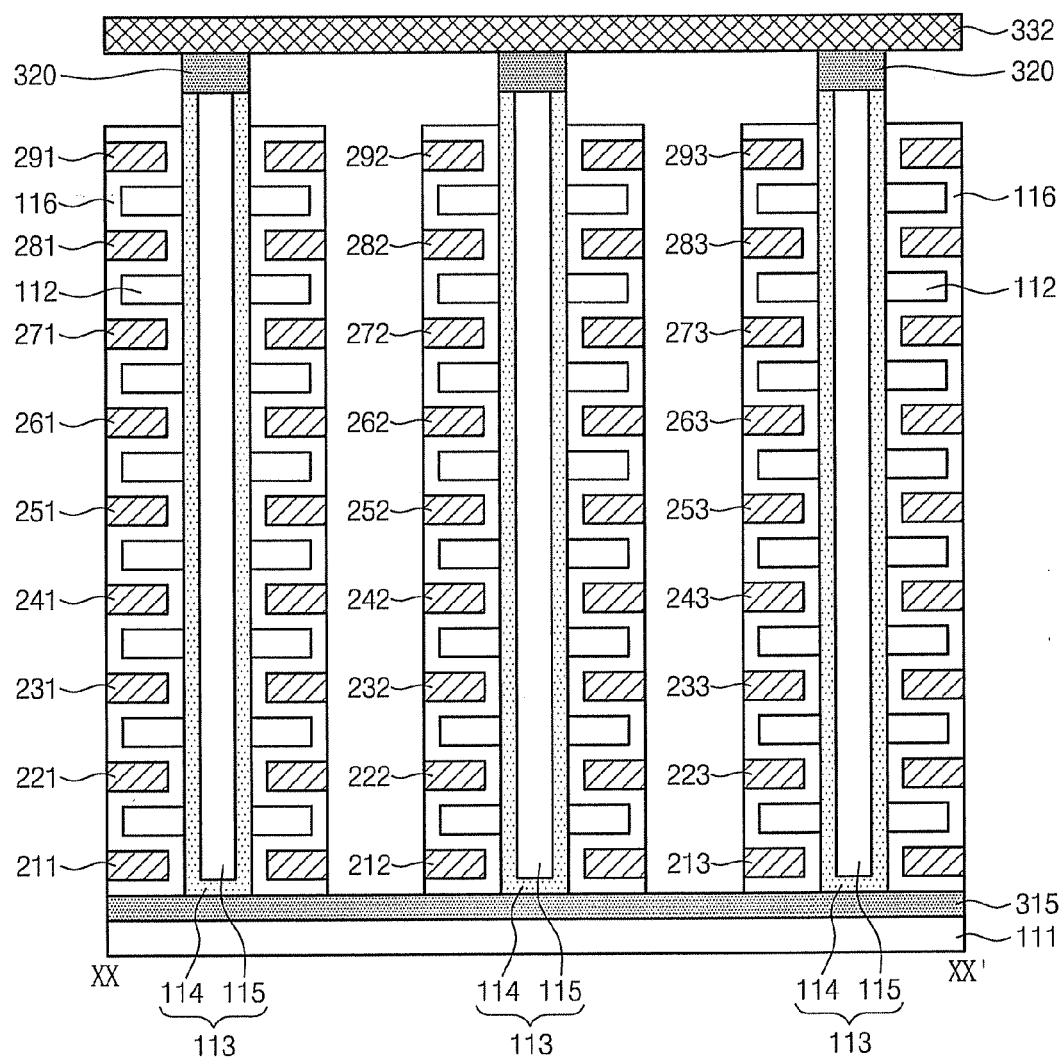

FIG. 19 is a perspective view of one of the memory blocks illustrated in FIG. 1 according to still other example embodiments of the inventive concepts. FIG. 20 is a cross-sectional view taken along line XX-XX' of the memory block illustrated in FIG. 19. Referring to FIGS. 19 and 20, a memory block BLKj may be implemented the same or similar as described in FIGS. 2-18 except that the second type doping region 315 may be provided under pillars 113 in a plate shape. An equivalent circuit of the memory block BLKj may be identical or similar to those described in FIGS. 15-18.

Figure 21:
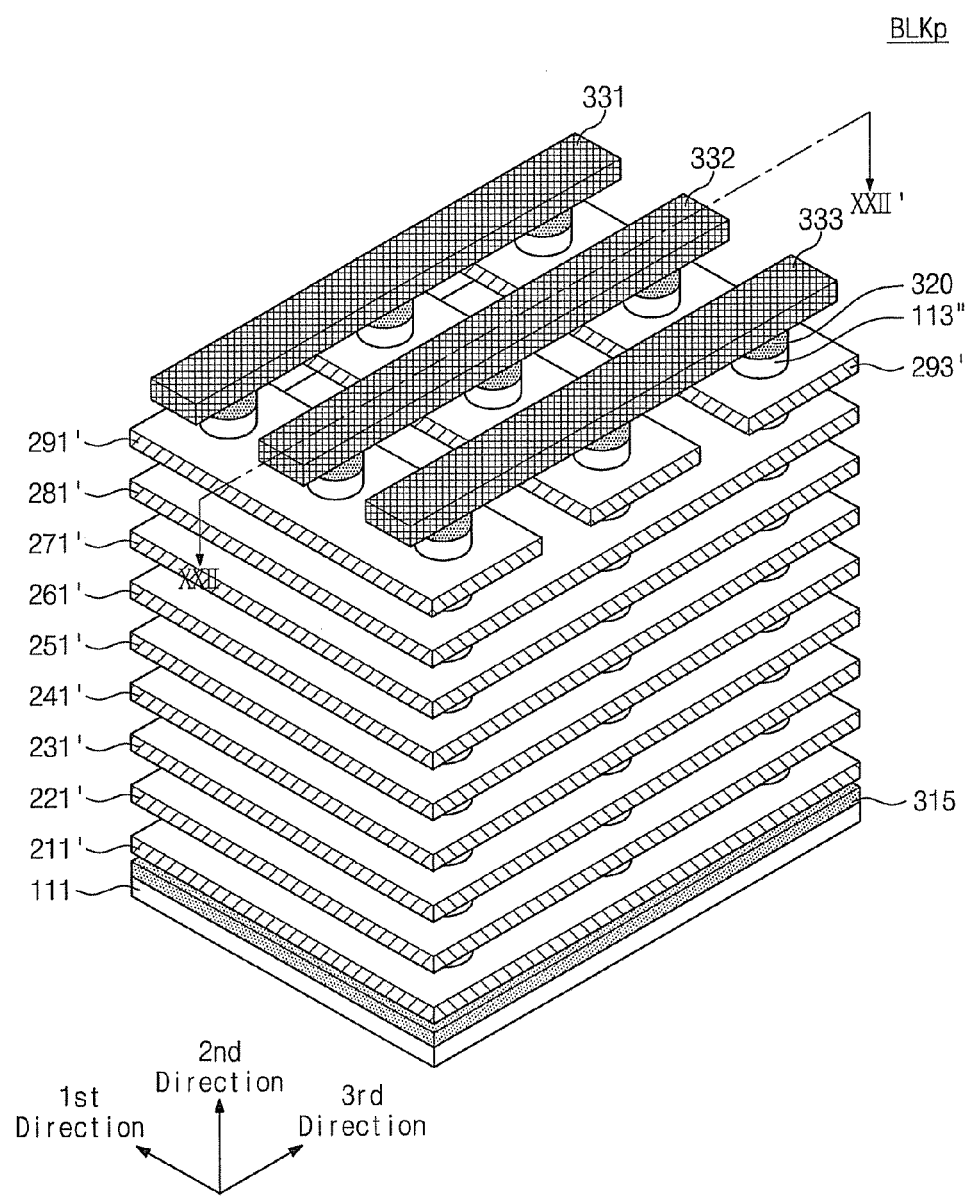
Figure 22:
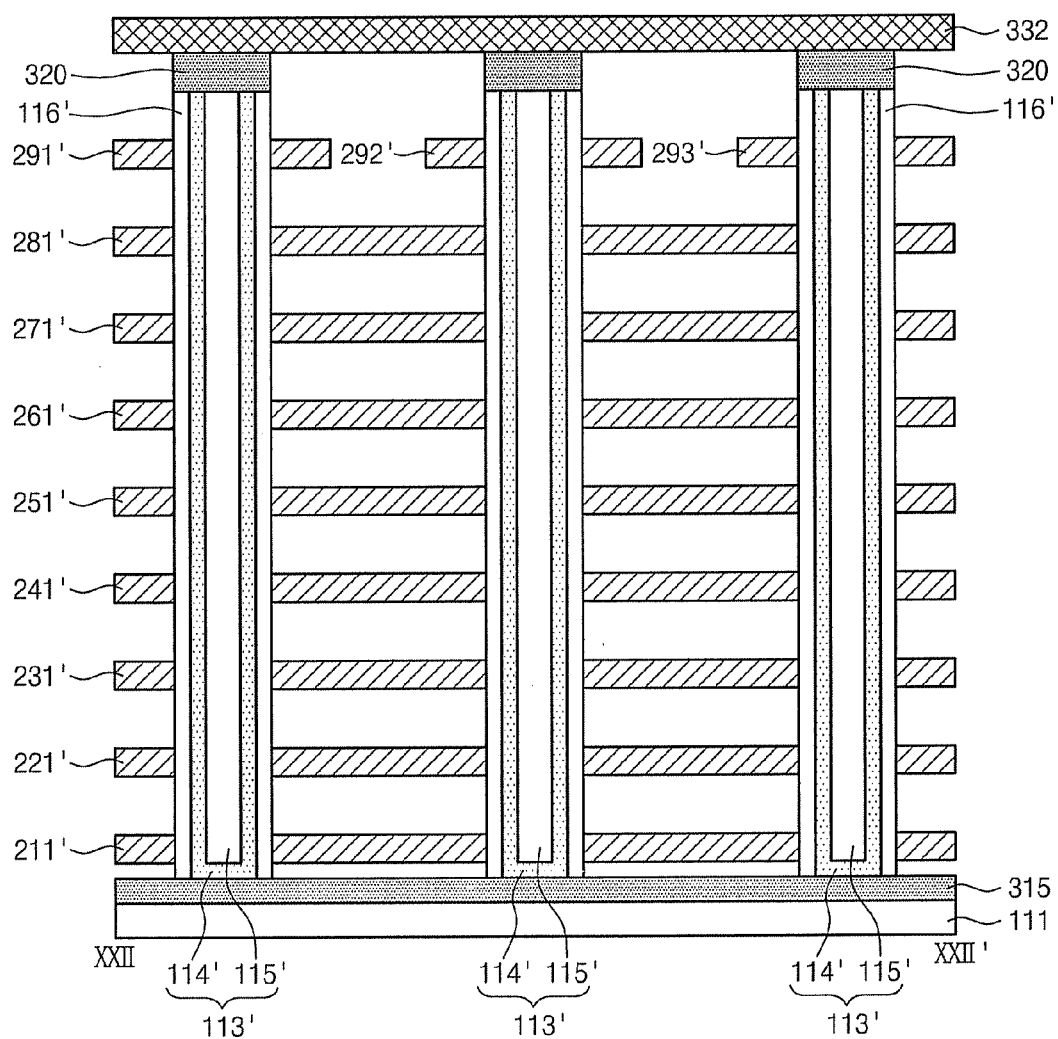

FIG. 21 is a perspective view of one of the memory blocks illustrated in FIG. 1 according to yet still other example embodiments of the inventive concepts. FIG. 22 is a cross-sectional view taken along line XXII-XXII' of the memory block illustrated in FIG. 21. Referring to FIGS. 21 and 22, a memory block BLKp may include a second doping region 315 provided on a substrate 101 in a plate shape. Conductive materials 221' to 281' may be formed in a plate shape. An insulation film 116' may be on a surface layer 116' of a pillar 113'. An intermediate layer 114' of the pillar 113' may include, for example, p-type silicon. The intermediate layer 114' of the pillar 113' may act as a body 114' of the second direction. An inner layer 115' of the pillar 113' may include, for example, an insulation material.

Figure 23:
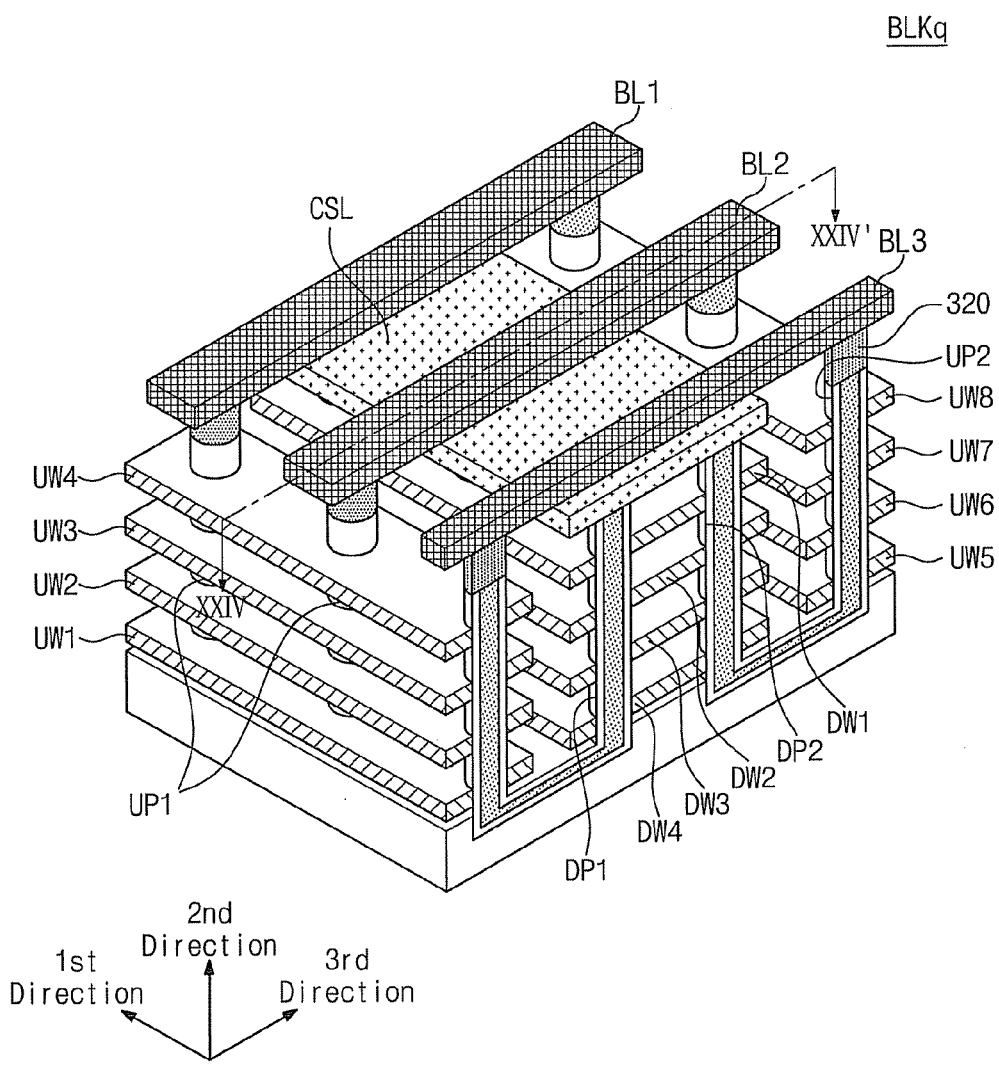
Figure 24:
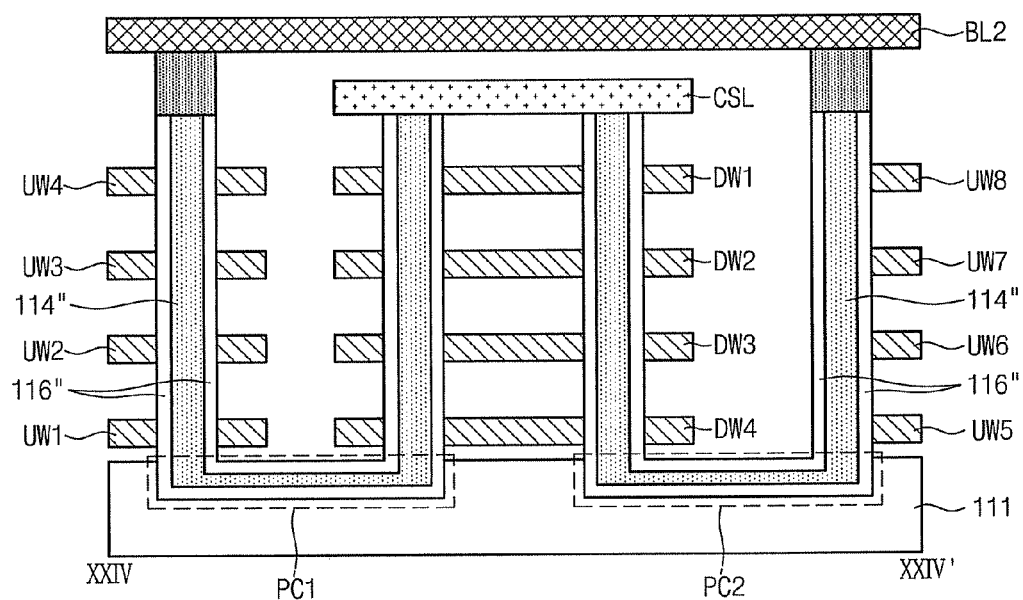

FIG. 23 is a perspective view of one of the memory blocks illustrated in FIG. 1 according to still further example embodiments of the inventive concepts. FIG. 24 is a cross-sectional view taken along line XXIV-XXIV' of the memory block illustrated in FIG. 23. Referring to FIGS. 23 and 24, on a substrate 111 of a memory block BLKq, the first to fourth upper word lines UW1-UW4 extending in the first direction may be sequentially provided along the second direction. First to fourth upper word lines UW1-UW4 may be provided to be spaced apart along the second direction. First upper pillars UP1 may be disposed sequentially along the first direction to penetrate the first to fourth upper word lines UW1-UW4.

On the substrate 111, the first to fourth lower word lines DW1-DW4 extending in the first direction may be provided sequentially in the second direction. The first to fourth lower word lines DW1-DW4 may be provided to be spaced apart in the second direction. The first lower pillars DP1 may be disposed sequentially in the first direction to penetrate the first to fourth lower word lines DW1-DW4 in the second direction. The second lower pillars DP2 may be disposed sequentially in the first direction to penetrate the first to fourth lower word lines DW1-DW4 in the second direction. According to at least one example embodiment, the first lower pillars DP1 and the second lower pillars DP2 may be disposed in parallel along the second direction.

On a substrate 111, the fifth to eight upper word lines UW5-UW8 extending along the first direction may be sequentially provided along the second direction. The fifth to eight upper word lines UW5-UW8 may be provided to be spaced apart along the second direction. The second upper pillars UP2 may be disposed sequentially along the first direction to penetrate the fifth to eight upper word lines UW5-UW8. A common source line CSL extending in the first direction may be provided on the first and second lower pillars DP1 and DP2. According to at least one example embodiment, the common source line CSL may be n-type silicon. According to at least one example embodiment, in the event that the common source line CSL is metal or a non-polar conductive material such as polysilicon, n-type sources may be provided between the common source line CSL and the first and second lower pillars DP1 and DP2.

According to at least one example embodiment, the common source line CSL and the first and second lower pillars DP1 and DP2 may be connected via contact plugs (not shown), respectively. Drains 320 may be on the first and second upper pillars UP1 and UP2, respectively. According to at least one example embodiment, the drains 320 may be, for example, n-type silicon. On the drains 320, a plurality of bit lines BL1-BL3 extending along the third direction may be provided sequentially in the first direction. According to at least one example embodiment, the bit lines BL1-BL3 and the drains 320 may be connected via contact plugs (not shown).

Each of the first and second upper pillars UP1 and UP2 may include a surface layer 116" and an inner layer 114". Each of the first and second lower pillars DP1 and DP2 may include a surface layer 116" and an inner layer 114". The surface layers 116" of the first and second upper pillars UP1 and UP2 and the first and second lower pillars DP1 and DP2 may include, for example, a blocking insulation film, a charge storage film, and a tunneling insulation film, respectively.

The tunnel insulation film may include, for example, a thermal oxide film. The charge storage film may include a nitride layer and/or metal oxide layer (e.g., an aluminum oxide layer and/or a hafnium oxide layer). The blocking insulation film may be formed as a single layer or a multi-layer. The blocking insulation film may be a high dielectric layer (e.g., an aluminum oxide layer and/or a hafnium oxide layer) having a higher dielectric constant than the tunnel insulation film and charge storage film. The tunnel insulation, charge storage film and block insulation film may form oxide-nitride-oxide (ONO). The inner layers 114" of the first and second upper pillars UP1 and UP2 and the first and second lower pillars DP1 and DP2 may be, for example, p-type silicon, respectively. The inner layers 114" of the first and second upper pillars UP1 and UP2 and the first and second lower pillars DP1 and DP2 may act as a body.

The first upper pillars UP1 may be connected with the first lower pillars DP1 via the first pipeline contacts PC1, respectively. According to at least one example embodiment, surface layers 116" of the first upper pillars UP1 may be connected with those of the first lower pillars DP1 via the first pipeline contacts PC1, respectively. Surface layers of the first pipeline contacts PC1 may be of the same material as the surface layers 116" of the pillars UP1 and DP1. According to at least one example embodiment, inner layers 114" of the first upper pillars UP1 may be connected with those of the first lower pillars DP1 via inner layers of the first pipeline contacts PC1, respectively. The inner layers of the first pipeline contacts PC1 may be of the same material as the inner layers 114" of the pillars UP1 and DP1.

The first upper pillars UP1 and the first to fourth upper word lines UW1-UW4 may form the first upper strings, and the first lower pillars DP1 and the first to fourth lower word lines DW1-DW4 may form the first lower strings. The first upper strings may be connected with the first lower strings via the first pipeline contacts PC1, respectively. The drains 320 and the bit lines BL1-BL3 may be connected with one ends of the first upper strings. A common source line CSL may be connected with one ends of the first lower strings. The first upper strings and the first lower strings may form a plurality of strings connected between the bit lines BL1-BL3 and the common source line CSL.

Likewise, the second upper pillars UP2 and the fifth to eight upper word lines UW5-UW8 may form the second upper strings, and the second lower pillars DP2 and the first to fourth lower word lines DW1-DW4 may form the second lower strings. The second upper strings may be connected with the second lower strings via the second pipeline contacts PC2, respectively. The drains 320 and the bit lines BL1-BL3 may be connected with one end of the second upper strings. The common source line CSL may be connected with one end of the second lower strings. The second upper strings and the second lower strings may be a plurality of strings connected between the bit lines BL1-BL3 and the common source line CSL.

An equivalent circuit of a memory block BLKq may be identical to that in FIG. 2 except that one string includes eight transistors and two strings are connected with each of the first to third bit lines BL1-BL3. Word lines, bit lines and strings in the memory block BLKq may be not limited in number to this disclosure. According to at least one example embodiment, the first and second pipeline contact gates (not shown) may be provided to form a channel at bodies 114" within the first and second pipeline contacts PC1 and PC2. The first and second pipeline contact gates (not shown) may be provided on the first and second pipeline contacts PC1 and PC2. According to at least one example embodiment, there may be described an example that lower word lines DW1-DW4 may be shared at adjacent lower pillars DP1-DP2. If upper pillars adjacent to the upper pillars UP1 or UP2 may be added, the adjacent upper pillars may be formed to share upper word lines UW1-UW4 or UW5-UW8.

Figure 25:
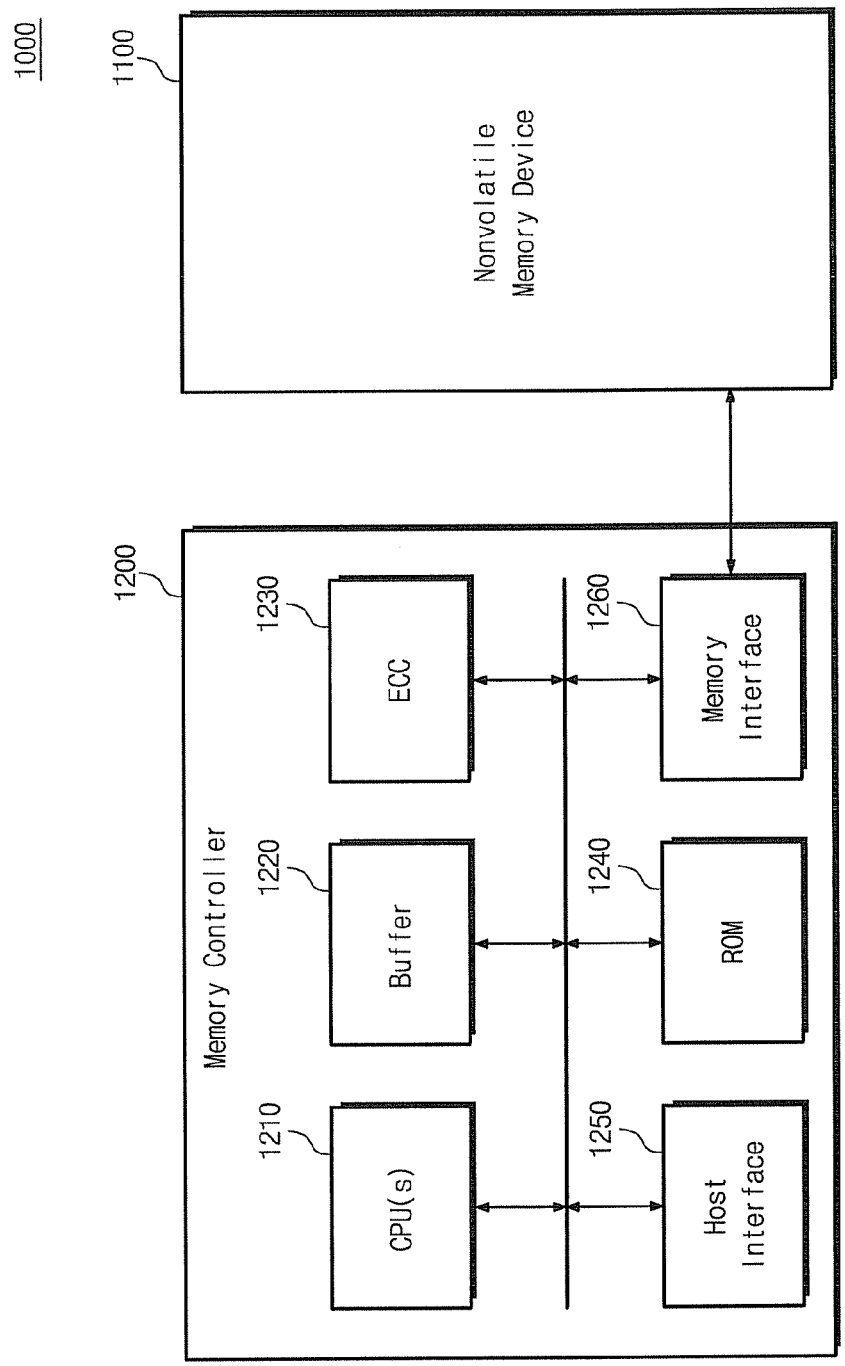

FIG. 25 is a block diagram illustrating memory systems according to example embodiments of the inventive concepts. Referring to FIG. 25, a memory system 1000 may include a nonvolatile memory device 1100 and a memory controller 1200. The nonvolatile memory device 1100 may be configured to perform a channel boosting operation after inhibit strings are set to the same initial channel voltage at programming. The nonvolatile memory device 1100 may be implemented in the same manner as one of the nonvolatile memory devices 100 of FIG. 1.

The memory controller 1200 may control the nonvolatile memory device 1100 according to a request of an external device (e.g., a host). For example, the memory controller 1200 may control read/write/erase operations of the nonvolatile memory device 1100. The memory controller 1200 may provide an interface between the nonvolatile memory device 1100 and the host. The memory controller 1200 may drive a firmware for controlling the nonvolatile memory device 1100. The memory controller 1200 may include at least one Central Processing Unit (CPU) 1210, a buffer 1220, an Error Correction Circuit (ECC) 1230, a Read-Only Memory (ROM) 1240, a host interface 1250, and a memory interface 1260.

The CPU 1210 may control overall operations of the memory controller 1200. The buffer 1220 may be used as a working memory of the CPU 1210. Upon write request of the host, data received from the host may be temporarily stored in the buffer 1220. Upon read request of the host, data read from the nonvolatile memory device 1100 may be temporarily stored in the buffer 1220. Upon the write request, the ECC 1230 may use an error correction code to decode data stored in the buffer 1220. The decoded data and the error correction code value may be stored in the nonvolatile memory device 1100. Upon the read request, the ECC 1230 may use an error correction code value to restore data read from the nonvolatile memory device 1100. The error correction code value may be included in the read data. The ROM 1240 may store data used to drive the memory controller 1200.

The host interface 1250 may include a protocol for data exchange between the host and the memory controller 1200. For example, the memory controller 1200 may be configured to communicate with an external device (host) via one of various interface protocols, for example, Universal Serial Bus (USB) protocols, Multimedia Card (MMC) protocols, Peripheral Component Interconnection (PCI) protocols, PCI-Express (PCI-E) protocols, Advanced Technology Attachment (ATA) protocols, serial-ATA protocols, parallel-ATA protocols, Small Computer Small Interface (SCSI) protocols, Enhanced Small Disk Interface (ESDI) protocols, and Integrated Drive Electronics (IDE) protocols.

The memory interface 1260 may interface between the nonvolatile memory device 1100 and the memory controller 1200. The memory system 1000 according to example embodiments of the inventive concepts may determine (e.g., easily) a pass voltage by setting inhibit strings to the same initial channel voltage at programming as described above with respect to FIGS. 1-24. The memory system 1000 may reduce program disturbance as compared with a typical memory system which does not provide the same initial channel voltage.

Figure 26:
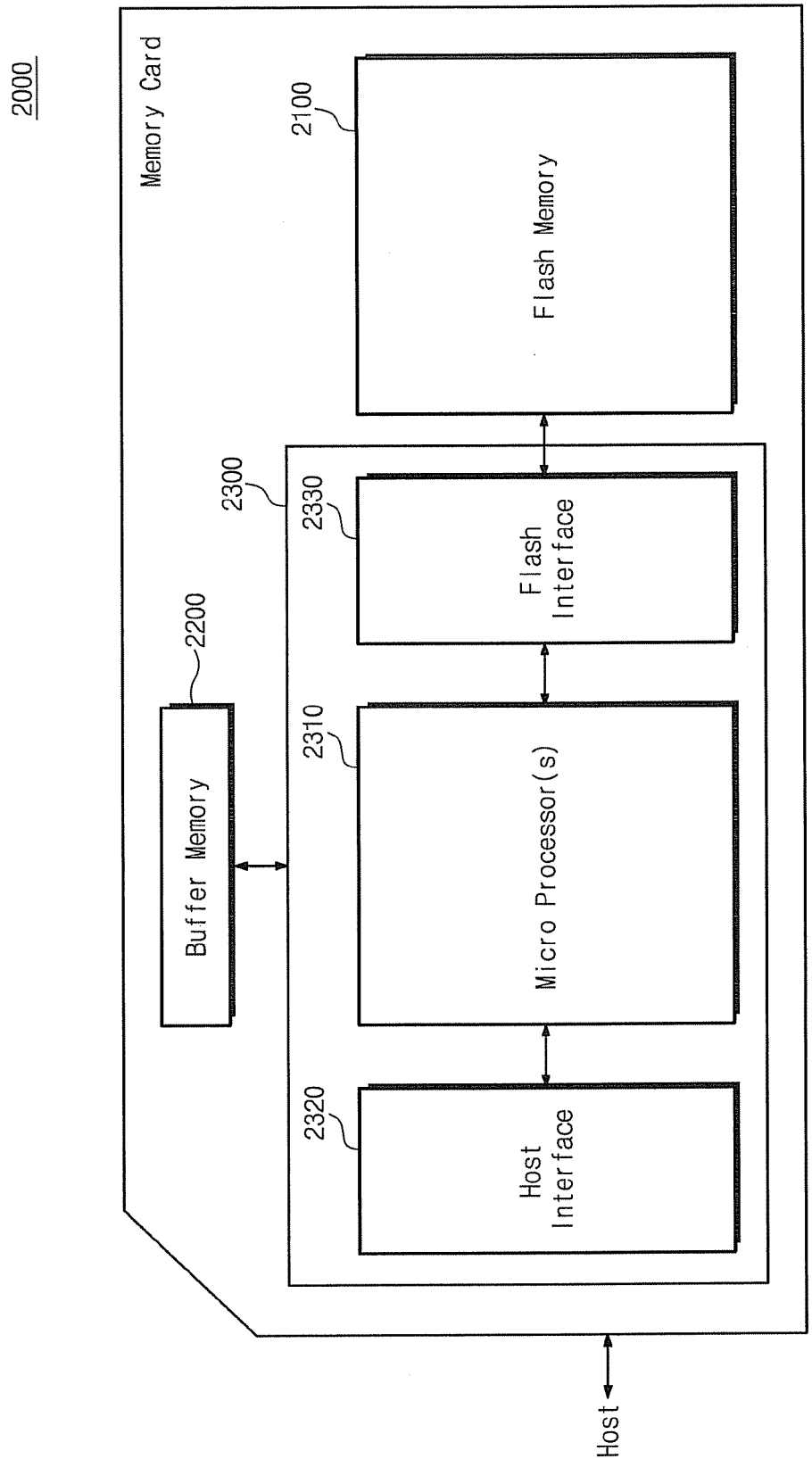

FIG. 26 is a block diagram illustrating memory cards according to example embodiments of the inventive concepts. Referring to FIG. 26, a memory card 2000 may include a flash memory 2100, a buffer memory 2200 and a memory controller 2300 for controlling the flash memory 2100 and the buffer memory 2200. The flash memory device 2100 may be configured to perform a channel boosting operation after inhibit strings may be set to the same initial channel voltage at programming as described above with respect to FIGS. 1-24. The flash memory 2100 may be implemented in the same or similar manner to one of the nonvolatile memory devices 100 of FIG. 1.

The buffer memory 2200 may be used to temporarily store data generated during the operation of the memory card 2000. The buffer memory 2200 may be implemented using, for example, a DRAM and/or an SRAM. The memory controller 2300 may be connected between a host and the flash memory 2100. The memory controller 2300 may be configured to access the flash memory 2100 in response to a request from the host. The memory controller 2300 may include at least one microprocessor 2310, a host interface 2320, and a flash interface 2330.

The micro processor 2310 may be configured to drive a firmware for controlling the flash memory 2100. The host interface 2320 may interface with the host via a card (e.g., MMC) protocol for data exchanges between the host and the memory interface 2330. The memory card 2000 may be applicable to Multimedia Cards (MMCs), Security Digitals (SDs), miniSDs, memory sticks, smartmedia, and/or transflash cards. The memory card 2000 according to example embodiments of the inventive concepts may be suitable for optimizing and/or improving a pass voltage because channels of strings are boosted from the same initial channel voltage. The optimizing and/or improving of the pass voltage may enable program disturbance reduction, resulting in improvement of data reliability. The memory card 2000 according to example embodiments of the inventive concepts may store data stably and quickly by performing a bit line setup operation together with channel boosting.

Figure 27:
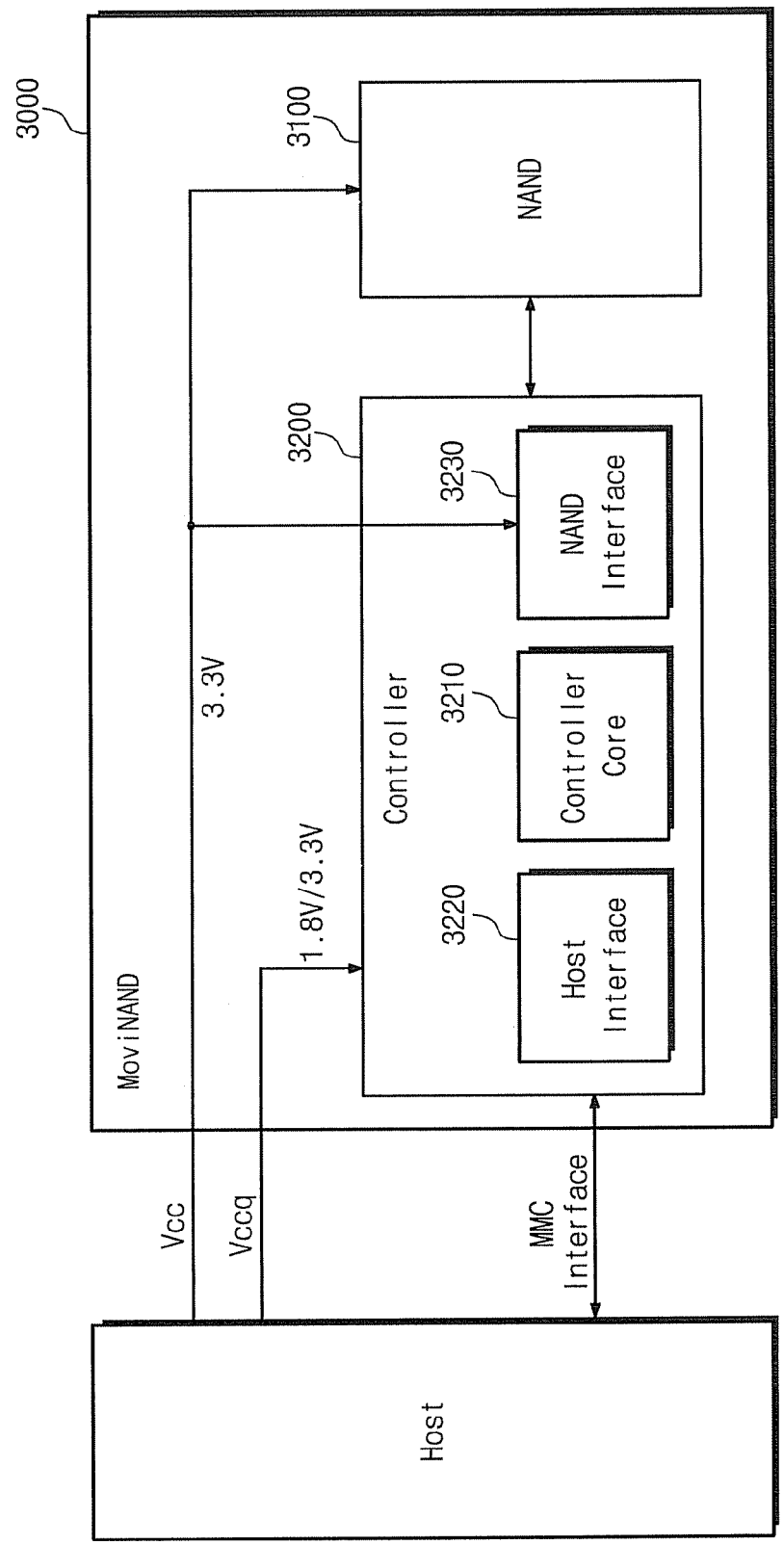

FIG. 27 is a block diagram illustrating moviNANDs according to example embodiments of the inventive concepts. Referring to FIG. 27, a moviNAND device 3000 may include a NAND flash memory device 3100 and a controller 3200. The NAND flash memory device 3100 may be configured using a stack of unitary NAND flash memories in a package (e.g., Fine-pitch Ball Grid Array (FBGA)). The unitary NAND flash memory device may be configured to perform a channel boosting operation after inhibit strings are set to the same initial channel voltage at programming as described above with respect to FIGS. 1-24. Each of the unitary NAND flash memories may be implemented in the same manner as one of the nonvolatile memory devices 100 of FIG. 1.

The controller 34 may include at least one controller core 3210, a host interface 3220, and a NAND interface 3230. The controller core 3210 may control overall operations of the moviNAND device 3000. The host interface 3220 may be configured to interface between the controller 34 and an MMC of a host. The NAND interface 3230 may be configured to interface between the NAND flash memory device 3100 and the controller 3200. If a unitary NAND flash memory device of the NAND flash memory device 3100 may be formed of a non-volatile memory device in FIG. 21, the controller 3200 may be identical to that in FIG. 21.

The moviNAND device 30 may receive power supply voltages Vcc and Vccq from the host. The power supply voltage Vcc (e.g., about 3.3V) may be supplied to the NAND flash memory device 3100 and the NAND interface 3230, while the power supply voltage Vccq (e.g., about 1.8V/3.3V) may be supplied to the controller 3200. The moviNAND device 3000 may reduce a program time by performing a bit line setup operation together with channel boosting. The moviNAND device 3000 may be advantageous to store a large amount of data. The moviNAND 3000 may include a NAND flash memory device 3100 configured with three mats in a sub-30 nm process, thereby considerably expanding data storage capacity within a limited chip size. Example embodiments of the inventive concepts may be applicable to a solid state drive (SSD).

Figure 28:
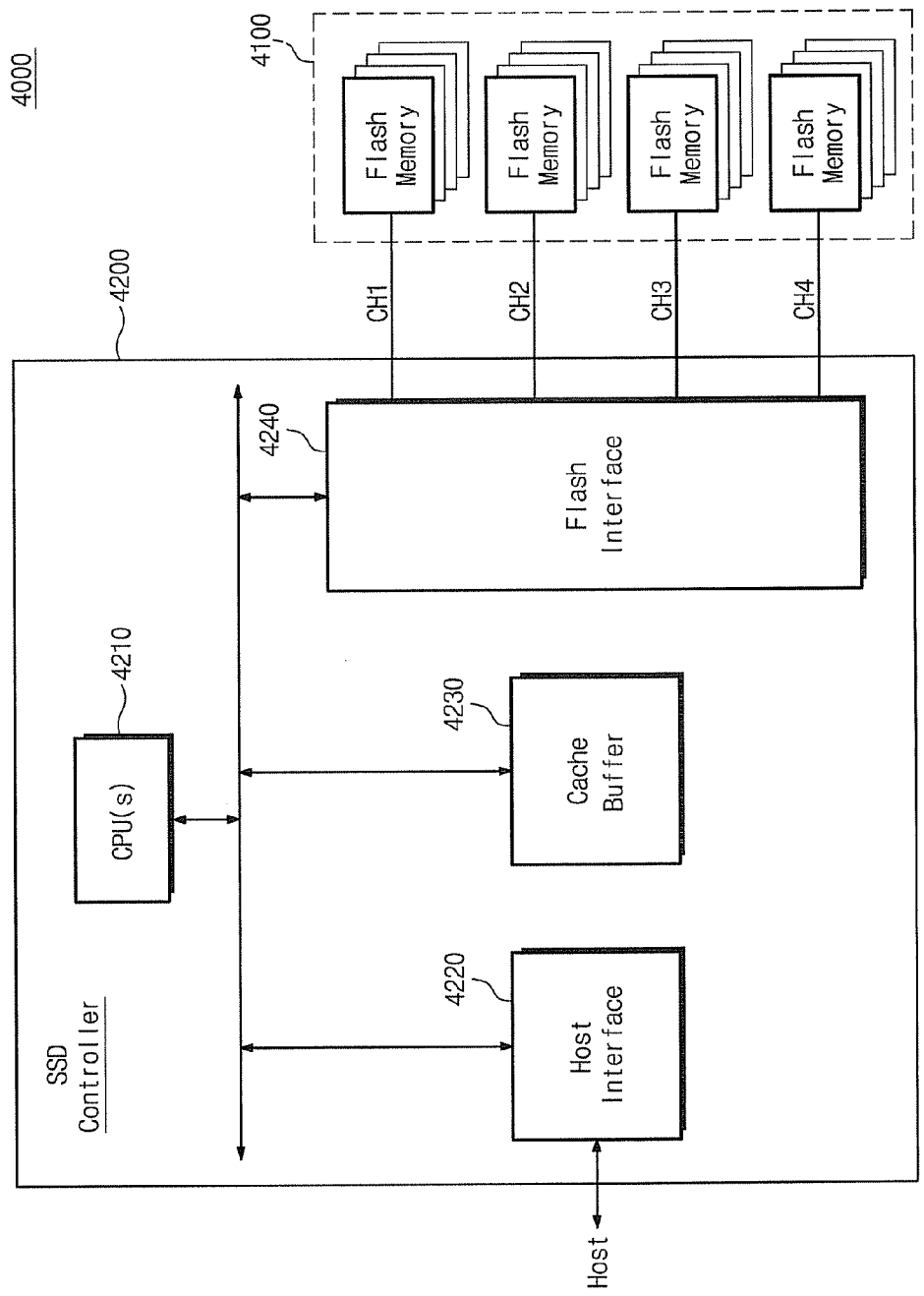

FIG. 28 is a block diagram illustrating SSDs according to example embodiments of the inventive concepts. Referring to FIG. 28, an SSD 4000 may include a plurality of flash memory devices 4100 and an SSD controller 4200. The flash memory devices 4100 may be configured to perform a channel boosting operation after inhibit strings are set to the same initial channel voltage at programming as described above with respect to FIGS. 1-24. Each of the flash memory devices 4100 may be implemented in the same manner as one of the nonvolatile memory devices 100 of FIG. 1.

The SSD controller 4200 may control the plurality of flash memory devices 4100. The SSD controller 4200 may include at least one CPU 4210, a host interface 4220, a cache buffer 4230, and a flash interface 4240. Under the control of the CPU 4210, the host interface 4220 may exchange data with a host through ATA protocol. The host interface 4220 may be at least one of a Serial Advanced Technology Attachment (SATA) interface, a Parallel Advanced Technology Attachment (PATA) interface, and an External SATA (ESATA) interface.

Data to be received or transmitted from or to the host through the host interface 4220 may be delivered to the cache buffer 4230 without passing through a CPU bus, under the control of the CPU 4210. The cache buffer 4230 may temporarily store data transferred between external devices and the flash memory devices 4100. The cache buffer 4230 may also be used to store programs to be executed by the CPU 4210. The cache buffer 4230 may be regarded as a kind of buffer memory, and may be implemented using an SRAM.

The flash interface 4240 may be configured to interface between the SSD controller 4200 and the flash memory devices 4100 that are used as storage devices. The flash interface 4240 may be configured to support NAND flash memories, One-NAND flash memories, multi-level flash memories, and/or single-level flash memories. The SSD 4000 may optimize and/or improve a pass voltage for reducing the program disturbance by performing a channel boosting operation so that inhibit strings have the same channel voltage. According to the SSD 4000, it may be possible to improve data reliability.

Figure 29:
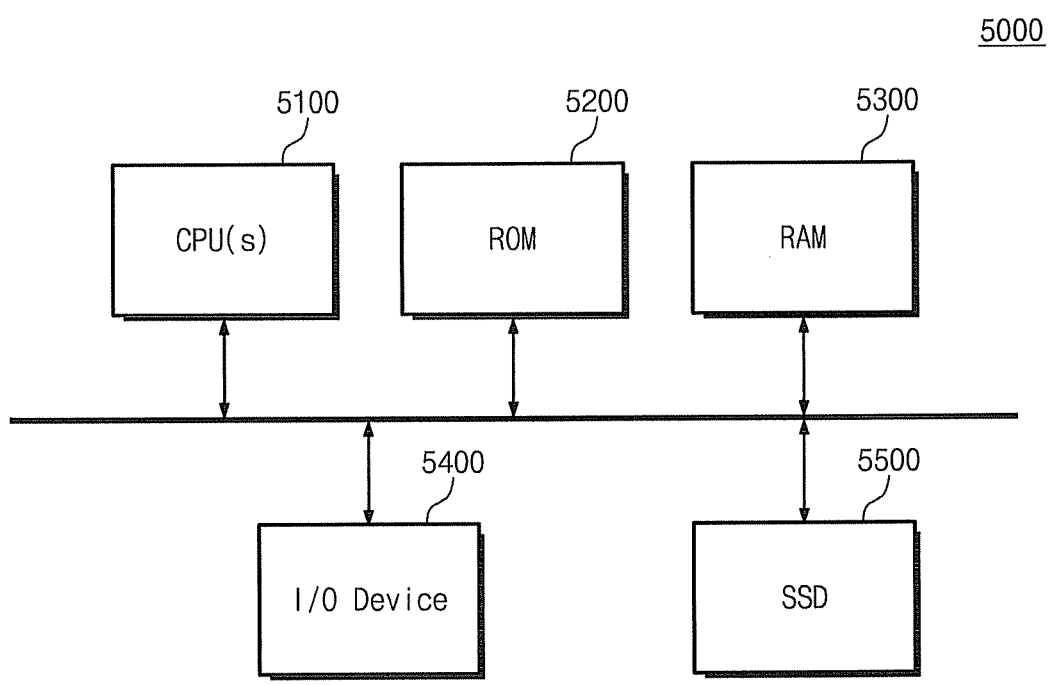

FIG. 29 is a block diagram of computing systems according to example embodiments of the inventive concepts. Referring to FIG. 29, a computing system 5000 may include at least one CPU 5100, a ROM 5200, a RAM 5300, an input/output (I/O) device 5400, and an SSD 5500. The CPU 5100 may be connected to a system bus. The ROM 5200 may store data used to drive the computing system 5000. The data may include a start command sequence and/or a basic I/O system (BIOS) sequence. The RAM 5300 may temporarily store data generated during the execution of the CPU 5100. The I/O device 5400 may be connected to the system bus through an I/O device interface. Examples of the I/O device 5400 may include keyboards, pointing devices (e.g., mouse), monitors, and/or modems. The SSD 5500 may be a readable storage device and may be implemented in the same manner as the SSD 4000 of FIG. 28.

Figure 30:
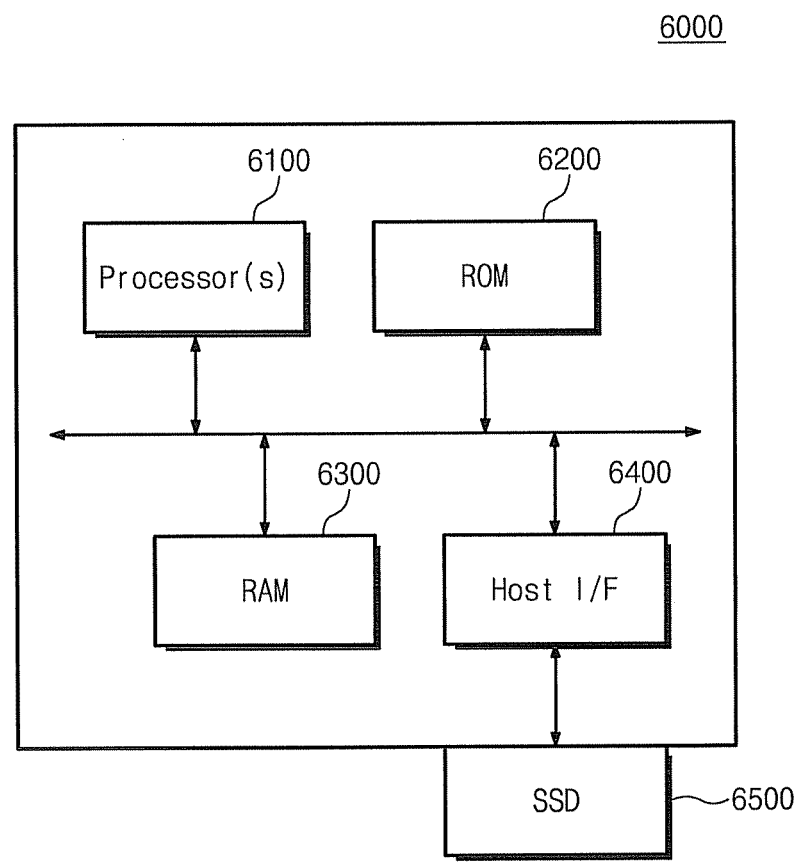

FIG. 30 is a block diagram of electronic devices according to example embodiments of the inventive concepts. Referring to FIG. 30, an electronic device 6000 may include at least one processor 6100, a ROM 6200, a RAM 6300, a host interface (I/F) 6400, and an SSD 6500. The processor 6100 may access the RAM 6300 to execute firmware codes and/or other necessary codes. The processor 6100 may access the ROM 6200 to execute various command sequences such as a start command sequence and a basic I/O system (BIOS) sequence. The host interface 6400 may be configured to interface between the electronic device 6000 and the SSD 6500. The SSD 6500 may be detachable from the electronic device 6000. The SSD 6500 may be implemented in the same manner as the SSD 4000 of FIG. 28. Examples of the electronic device 6000 may include cellular phones, personal digital assistants (PDAs), digital cameras, camcorders, portable audio players (e.g., MP3), and portable media players (PMPs).

Figure 31:
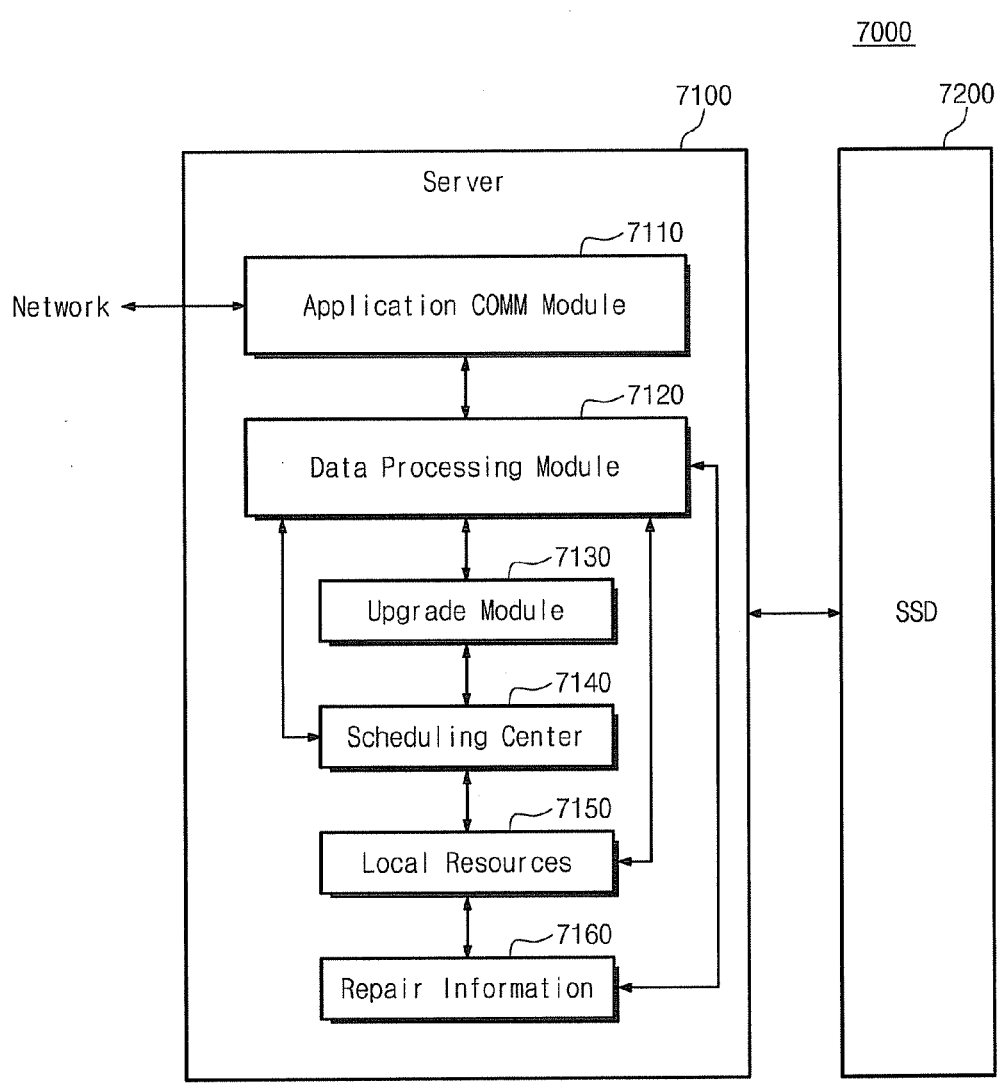

FIG. 31 is a block diagram of server systems according to example embodiments of the inventive concepts. Referring to FIG. 31, a server system 7000 may include a server 7100 and an SSD 7200 that stores data used to drive the server 7100. The SSD 7200 may be configured in the same manner as the SSD 4000 of FIG. 28. The server 7100 may include an application communication module 7110, a data processing module 7120, an upgrade module 7130, a scheduling center 7140, a local resource module 7150, and a repair information module 7160.

The application communication module 7110 may be configured to communicate with a computing system connected to a network and the server 7100, or to allow the server 7100 to communicate with the SSD 7200. The application communication module 7110 may transmit data or information, provided through a user interface, to the data processing module 7120. The data processing module 7120 may be linked to the local resource module 7150. The local resource module 7150 may provide a list of repair shops/dealers/technical information to a user on the basis of information or data inputted to the server 7100.

The upgrade module 7130 may interface with the data processing module 7120. Based on information or data received from the SSD 7200, the upgrade module 7130 may perform upgrades of a firmware, a reset code, a diagnosis system, and/or other information on electronic appliances. The scheduling center 7140 may provide real-time options to the user based on the information or data inputted to the server 7100. The repair information module 7160 may interface with the data processing module 7120. The repair information module 7160 may be used to provide repair-related information (e.g., audio, video and/or document files) to the user. The data processing module 7120 may package information related to the information received from the SSD 7200. The packaged information may be transmitted to the SSD 7200 and/or may be displayed to the user.

The memory systems and/or the storage devices according to example embodiments of the inventive concepts may be mounted in various types of packages. Examples of the packages of the memory system and/or the storage device according to example embodiments of the inventive concepts may include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and/or Wafer-level Processed Stack Package (WSP).

Channels of strings may be set up by the same initial channel voltage at programming. This may make it possible to easily determine an optimum and/or improved pass voltage. It may be possible to reduce a program time.

While example embodiments have been particularly shown and described, it will be understood by one of ordinary skill in the art that variations in form and detail may be made therein without departing from the spirit and scope of the claims.

What is claimed is:

1. A program method of a non-volatile memory device which includes groups of memory cells sequentially provided in a direction vertical to a substrate and in which at least two strings are connected to one bit line, the program method comprising:

performing a bit line setup operation together with a channel boosting operation; and performing a program execution operation by applying a program voltage to a selected word line, wherein the performing a bit line setup operation includes, during a first bit line setup period, applying a power supply voltage to unselected bit lines, floating all strings of a selected memory block, and applying a pass voltage to the selected word line and unselected word lines, and wherein the floating of the strings of the selected memory block includes applying a ground voltage to a ground selection line and to all string selection lines.

2. The program method of claim 1, wherein the performing a bit line setup operation includes, during a second bit line setup period, setting a channel of a selected string to a ground voltage by applying a power supply voltage to a selected string selection line of the string selection lines.

3. The program method of claim 2, wherein the performing a program execution operation includes applying the program voltage to the selected word line following the second bit line setup period.

4. A program method of a non-volatile memory device which includes groups of memory cells sequentially provided in a direction vertical to a substrate and in which at least two strings are connected to one bit line, the program method comprising:

performing a bit line setup operation together with a channel boosting operation; and performing a program execution operation by applying a program voltage to a selected word line, wherein the performing a bit line setup operation includes, during a first bit line setup period, applying a power supply voltage to all bit lines and all string selection lines, and applying a ground voltage to a ground selection line, and wherein the performing a bit line setup operation includes applying, during the first bit line setup period, the ground voltage to at least one unselected string selection line.

5. The program method of claim 4, wherein the performing a bit line setup operation includes, during a second bit line setup period, applying the ground voltage to a selected bit line of the bit lines in synchronization with the applying of the ground voltage to the at least one unselected string selection line, and applying a pass voltage to unselected word lines following the second bit line setup period.

6. The program method of claim 5, wherein the performing a program execution operation includes applying the program voltage to the selected word line following the second bit line setup period.

* * * * *